(12) United States Patent
Pi et al.

(10) Patent No.: US 10,771,067 B2
(45) Date of Patent: Sep. 8, 2020

(54) SYSTEM AND METHOD FOR HITLESS CLOCK SWITCHING

(71) Applicant: NEWCOSEMI (BEIJING) TECHNOLOGY CO., LTD, Beijing (CN)

(72) Inventors: Deyi Pi, Beijing (CN); Chang Liu, Beijing (CN); Jinliang Liu, Beijing (CN)

(73) Assignee: NEWCOSEMI (BEIJING) TECHNOLOGY CO., LTD (CN)

( * ) Notice: Subject to any disclaimer, the term of this patent is extended or adjusted under 35 U.S.C. 154(b) by 0 days.

(21) Appl. No.: 16/448,627

(22) Filed: Jun. 21, 2019

(65) Prior Publication Data
US 2019/0393879 A1 Dec. 26, 2019

(30) Foreign Application Priority Data

Jun. 21, 2018 (CN) .................... 2018 2 0962888 U
Jul. 5, 2018 (CN) .......................... 2018 1 0730399

(51) Int. Cl.
*H03K 17/00* (2006.01)
*H03L 7/081* (2006.01)
*H03L 7/091* (2006.01)
*H03L 7/087* (2006.01)

(52) U.S. Cl.
CPC .............. *H03L 7/081* (2013.01); *H03L 7/087* (2013.01); *H03L 7/091* (2013.01)

(58) Field of Classification Search
CPC ........... G06F 1/08; G06F 1/04; H03K 5/1252; H03K 5/135; H04L 7/0083
USPC .......................................................... 327/99
See application file for complete search history.

(56) References Cited

U.S. PATENT DOCUMENTS

| 2005/0062505 | A1* | 3/2005 | Takahashi | ................. H03L 7/07 327/99 |
| 2013/0266053 | A1* | 10/2013 | Tazaki | ..................... G06F 1/04 375/224 |

* cited by examiner

*Primary Examiner* — Anh Q Tra
(74) *Attorney, Agent, or Firm* — Workman Nydegger

(57) ABSTRACT

A system and a method for hitless clock switching are provided. In the system, a sampling circuitry group samples a primary reference clock signal and a secondary reference clock signal to obtain first and second sampling information, respectively. A phase detector group obtains a phase difference between the primary and secondary reference clock signals with the first and second sampling information. A compensator group adds the phase difference to a phase of the secondary reference clock signal to obtain a backup reference clock signal. When the primary reference clock signal is abnormal or missing, the signal selector determines the backup reference clock signal as a target reference clock signal and sends it to a phase-locked loop. The phase-locked loop performs loop control on the target reference clock signal, thereby implementing hitless switching of reference clock signals.

18 Claims, 17 Drawing Sheets

SYSTEM AND METHOD FOR HITLESS CLOCK SWITCHING

CROSS REFERENCE TO RELATED APPLICATIONS

The present application claims priority to Chinese Patent Application No. 201820962888.0, titled "SYSTEM FOR HITLESS CLOCK SWITCHING", filed on Jun. 21, 2018 with the China National Intellectual Property Administration, and Chinese Patent Application No. 201810730399.7, titled "SYSTEM FOR DETECTING CLOCK PHASE", filed on Jul. 5, 2018 with the China National Intellectual Property Administration, which are incorporated herein by reference in their entirety.

FIELD

The present disclosure relates to the technical field of clock control, and in particular to a system and a method for hitless clock switching.

BACKGROUND

As the telecommunication network continues to evolve from the circuit switching network to the packet switching network, synchronous Ethernet is increasingly being introduced into wireless base station backhaul. Considering the synchronization requirements of the cellular network base station, synchronous Ethernet must be able to achieve synchronous transmission of frequency, support hitless reference clock switching and meet strict standards of holdover performance. Thus, a hitless clock switching system is needed in the clock circuit.

In conventional art, the existing hitless clock switching system preforms tracking synchronization according to a reference clock, and outputs a synchronous clock and phase. Specifically, the tracking refers to dynamically adjusting the local clock by measuring changes in the local clock and reference clock in real time, so that the local clock is always consistent with the reference clock. Synchronization refers to adjusting the clock frequency of the local clock to the same clock frequency as the reference clock.

However, the applicant found that the hitless clock switching system in conventional art has at least the following disadvantages.

When the reference clock (also known as the primary reference clock) is abnormal or missing, the local clock will track and synchronize to a secondary reference clock. If there is a phase deviation between the two reference clocks (the primary reference clock and the secondary reference clock), a phase jitter (for example, TIE) will occur at the instant of switching. Phase jitter is a very important indicator for clock devices, and a clock device with an excessive phase jitter will not pass the standard test, which seriously affects the stability of the communication network.

In addition, the existing hitless clock switching system uses a phase-locked loop (PLL) to synchronize the reference clock phase information. When an abnormality occurs in the primary reference clock, the local clock is synchronized to the secondary reference clock, then clock-compensated by a phase-locked loop to offset the phase difference and outputted. Therefore, at least three phase-locked loops are needed in the existing hitless clock switching system (two phase-locked loops are used for the phase synchronization of the reference clock, and one phase-locked loop is used for the phase adjustment of the output clock), which increases the area of the system, power consumption and complexity.

SUMMARY

In view of this, the present disclosure provides a system and a method for hitless clock switching to solve the problem that the area of the system, power consumption and complexity are increased due to the fact that multiple phase-locked loops are needed in the existing system for hitless clock switching.

The system for hitless clock switching includes a sampling circuitry group, a phase detector group, a compensator group, a signal selector and a phase-locked loop which are sequentially connected.

The sampling circuitry group is configured to sample at least one set of reference clock signals to correspondingly obtain at least one set of sampling information and send the at least one set of sampling information to the phase detector group, where each set of the reference clock signals includes a primary reference clock signal and a secondary reference clock signal, primary reference clock signals in different sets of reference clock signals are the same, secondary reference clock signals in different sets of reference clock signals are different, and each set of sampling information includes first sampling information corresponding to the primary reference clock signal and second sampling information corresponding to the secondary reference clock signal.

The phase detector group includes at least one phase detector, where each phase detector receives a set of sampling information and processes the set of sampling information as received to obtain a phase difference, and sends the phase difference and the secondary reference clock signal to the compensator group.

The compensator group is configured to add the phase difference sent by each phase detector to a phase of the secondary reference clock signal sent by the same phase detector to obtain a backup reference clock signal, and send the backup reference clock signal to the signal selector, where the compensator group includes at least one compensator.

The signal selector is configured to receive the primary reference clock signal and at least one backup reference clock signal sent by the compensator group, determine the primary reference clock signal as received as a target reference clock signal in a case that the primary reference clock signal is normal, determine one of the at least one backup reference clock signal as the target reference clock signal in a case that the primary reference clock signal is abnormal or missing, and send the target reference clock signal as determined to the phase-locked loop.

The phase-locked loop is configured to perform loop control on the target reference clock signal as received.

The method for hitless clock switching according to the present disclosure includes:

sampling, by a sampling circuitry group, at least one set of reference clock signals to correspondingly obtain at least one set of sampling information, and sending the at least one set of sampling information to a phase detector group, where each set of reference clock signals includes a primary reference clock signal and a secondary reference clock signal, primary reference clock signals in different sets of reference clock signals are the same, secondary reference clock signals in different sets of reference clock signals are different, and each set of sampling information includes first sampling information corresponding to the primary reference clock signal and second sampling information corresponding to the secondary reference clock signal;

processing, by each phase detector of the phase detector group, a corresponding set of sampling information as received to obtain a phase difference, and sending the phase difference and the secondary reference clock signal to a compensator group;

adding, by the compensator group, the phase difference sent by each phase detector to a phase of the secondary reference clock signal to obtain a backup reference clock signal, and sending the backup reference clock signal to a signal selector, where the compensator group comprises at least one compensator;

receiving, by the signal selector, the primary reference clock signal and at least one backup reference clock signal sent by the compensator group, determining the primary reference clock signal as received as a target reference clock signal in a case that the primary reference clock signal is normal, determining one of the at least one backup reference clock signal as the target reference clock signal in a case that the primary reference clock signal is abnormal or missing, and sending the target reference clock signal as determined to a phase-locked loop; and performing, by the phase-locked loop, loop control on the target reference clock signal as received.

In the system and method for hitless clock switching according to the present disclosure, the sampling circuitry group samples each set of reference clock signals to obtain a set of sampling information including the first sampling information and the second sampling information, each phase detector of the phase detector group receives and processes the set of sampling information to obtain a phase difference, then the compensator group obtains a backup reference clock according to the phase difference sent by each phase detector and the secondary reference clock signal, and thus hitless switching is achieved by adding the phase difference to the phase of the secondary reference clock signal. When it is determined that the inputted primary reference clock signal is abnormal or missing, the signal selector selects one backup reference clock signal from the received at least one backup reference clock signal, determines the selected backup reference clock signal as the target reference clock signal, and sends the target reference clock signal as determined to the phase-locked loop, and the phase-locked loop performs smoothing processing on the target reference clock signal to generate a stable clock signal to ensure the stability of the phase, thereby the stable output of the clock signal and the stability of the performance of the clock device are ensured.

In addition, in the present disclosure, the phase-locked loop is not needed to synchronize the information of the reference clock. The system for hitless clock switching according to the present disclosure only uses one phase-locked loop for the output clock phase adjustment. Compared with the existing system for hitless clock switching, in which at least three phase-locked loops are needed, the system for hitless clock switching in the present disclosure has reduced area, power consumption and complexity.

BRIEF DESCRIPTION OF THE DRAWINGS

The drawings to be used in the description of the embodiments of the application or the conventional technology will be described briefly as follows, so that the technical solutions according to the embodiments of the present disclosure or according to the conventional technology will become clearer. It is apparent that the drawings in the following description only illustrate some embodiments of the present disclosure. For those skilled in the art, other drawings may be obtained according to these drawings without any creative work.

DETAILED DESCRIPTION

The technical solution of the present disclosure is hereinafter described in detail with reference to the accompanying drawings. It is evident that the embodiments are only some exemplary embodiments of the present disclosure, and the present disclosure is not limited to such embodiments. Other embodiments that those skilled in the art obtain based on embodiments of the present disclosure also all within the protection scope of the present disclosure.

Figure 1:
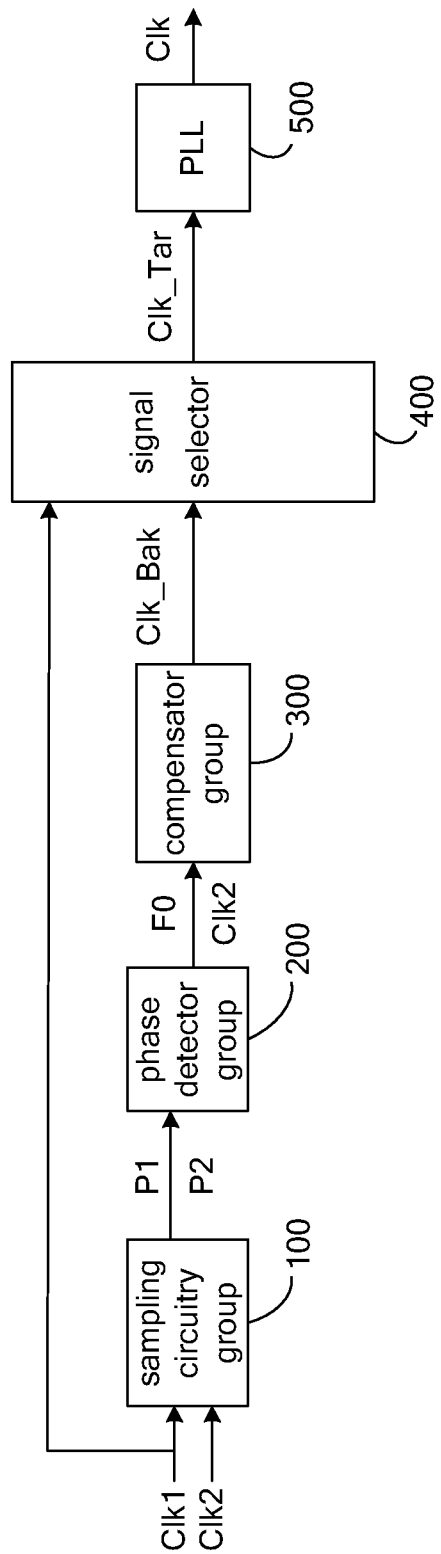
FIG. 1 is a schematic structural diagram of a system for hitless clock switching according to an embodiment of the present disclosure.

As shown in FIG. 1, a system for hitless clock switching is provided according to an embodiment of the present disclosure, which includes a sampling circuitry group 100, a phase detector group 200, a compensator group 300, a signal selector 400, and a phase-locked loop 500.

The sampling circuitry group 100 is connected to the phase detector group 200. The sampling circuitry group 100 includes at least one first sampling circuitry and at least one second sampling circuitry. The sampling circuitry group 100 is configured to sample at least one set of reference clock signals to obtain at least one set of sampling information. Each set of reference clock signals includes a primary reference clock signal Clk1 and a secondary reference clock signal Clk2. Accordingly, each set of sampling information includes first sampling information P1 corresponding to the primary reference clock signal and second sampling information P2 corresponding to the secondary reference clock signal. The first sampling information may be obtained by sampling the primary reference clock signal by the first sampling circuitry, and the second sampling information may be obtained by sampling the secondary reference clock signal by the second sampling circuitry. Only one set of reference clock signals is shown in FIG. 1, and it is understandable that when the sampling circuitry group 100 includes multiple first and second sampling circuitries, the sampling circuitry group 100 can sample multiple sets of reference clock signals, where the primary reference clock signals in different sets of reference signals are the same, and the secondary reference clock signals in different sets of reference signals are different.

The phase detector group 200 is connected to the compensator group 300. The phase detector group 200 includes at least one phase detector (also known as phase comparator in the art), each phase detector receives a set of sampling information and processes the set of sampling information as received to obtain a phase difference F0. In the present disclosure, each phase detector in the phase detector group 200 obtains a phase difference, and sends the obtained phase difference F0 and the corresponding secondary reference clock signal Clk2 to the compensator group 300.

The compensator group 300 includes at least one compensator. The compensator of the compensator group 300 is configured to add the phase difference sent by each phase detector to a phase of the secondary reference clock signal to obtain a backup reference clock signal Clk_Bak, so that hitless clock switching is achieved.

The signal selector 400 is configured to receive the primary reference clock signal and is connected to the compensator group 300 for receiving at least one backup reference clock signal sent by the compensator group 300. It can be understood that since backup reference clock signals are in one-to-one correspondence with phase detectors, the number of backup reference clock signals received by the signal selector 400 may be one or more.

In the present disclosure, when the primary reference clock signal is normal, the signal selector 400 determines the received primary reference clock signal as a target reference clock signal Clk_Tar. When the primary reference clock signal is abnormal or missing, the signal selector 400 determines one of the received at least one backup reference clock signals sent by the compensator group 300 as the target reference clock signal Clk_Tar, and sends the selected target reference clock signal Clk_Tar to the phase-locked loop 500.

The phase-locked loop 500 is connected to the signal selector 400 and configured to perform loop control on the received target reference clock signal.

In the system for hitless clock switching according to the present disclosure, each phase detector in the phase detector group 200 receives a set of sampling information and processes the set of sampling information received to obtain a phase difference, and the compensator group 300 obtains a set of phase-compensated backup reference clock signals according to the phase differences and the secondary reference clock signals sent by the phase detectors respectively, in which the phase difference is added to the phase of the secondary reference clock signal.

When it is determined that the input primary reference clock signal is normal, the signal selector 400 determines the received primary reference clock signal as a target reference clock signal. When it is determined that the input primary reference clock signal is abnormal or missing, the signal selector 400 determines one of the received at least one backup reference clock signal as the target reference clock signal. The signal selector 400 sends the determined target reference clock signal (the target reference clock signal is the primary reference clock signal or the determined one of the at least one backup reference clock signal sent from the compensator group 300) to the phase-locked loop 500. The phase-locked loop 500 performs loop control to finally generate a stable clock signal, which ensures the stability of the phase, thereby ensuring the stable output of the clock signal and the stability of the performance of the clock device.

In addition, in the present disclosure, no phase-locked loop for synchronizing the information of the reference clock is needed, and in fact, only one phase-locked loop for adjustment of clock phase is required. Compared with the existing system for hitless clock switching with at least three phase-locked loops, the present disclosure reduces the area of the system, system power consumption and complexity.

Figure 2:
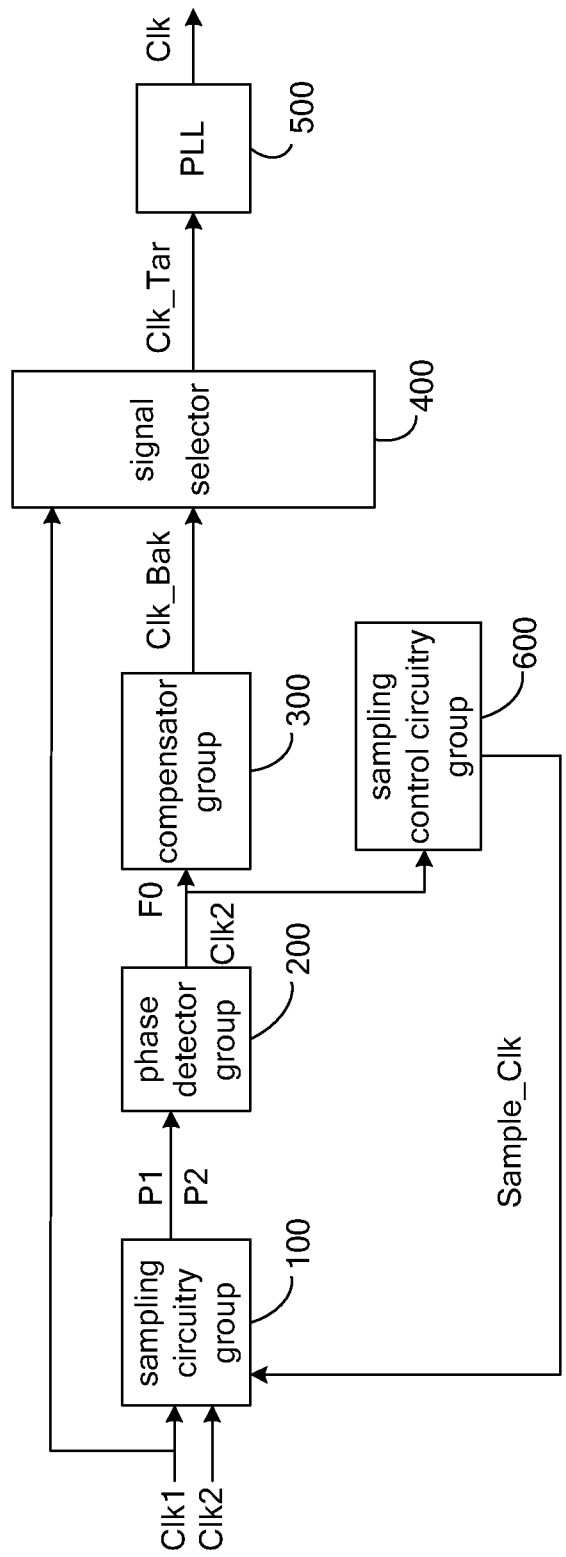
FIG. 2 is a schematic structural diagram of a system for hitless clock switching according to an embodiment of the present disclosure.

In an embodiment based on the embodiment shown in FIG. 1, the system for hitless clock switching further includes a sampling control circuitry group 600. As shown in FIG. 2, the sampling control circuitry group 600 is connected to the phase detector group 200 and the sampling circuitry group 100, and is configured to send a sampling control signal Sample_Clk to the sampling circuitry group 100 according to the phase difference F0 outputted by the phase detector group 200, so that the sampling circuitry group 100 uses the frequency of the sampling control clock signal Sample_Clk as a sampling frequency to sample. Specifically, the sampling control circuitry group 600 generates a sampling control clock signal Sample_Clk according to the phase difference F0 outputted by the phase detector group, and sends the sampling control clock signal Sample_Clk to the sampling circuitry group 100. After receiving the sampling control clock signal, the sampling circuitry group 100 will use the frequency of the sampling control clock signal as the sampling frequency to sample, and continue to perform the sampling operation at the sampling frequency. The functions of the compensator group 300, the signal selector 400 and the phase-locked loop 500 in this embodiment are the same as those of the corresponding components in the embodiment shown in FIG. 1, and therefore will not be described again.

In this embodiment, the sampling control circuitry group 600 generates and sends a sampling control clock signal to the sampling circuitry group 100 according to the phase difference outputted by the phase detector group 200, so that the sampling circuitry group 100 performs sampling at the frequency of the sampling control clock signal, which realizes the flexible adjustment of the sampling frequency of the sampling circuitry group 100 and ensures the accuracy of the phase difference outputted by the phase detector group 200.

In order to more clearly understand the system for hitless clock switching according to the above embodiment, the system for hitless clock switching according to the present disclosure will be described in more detail below by taking the phase detector group 200 including only one phase detector as an example.

Figure 3:
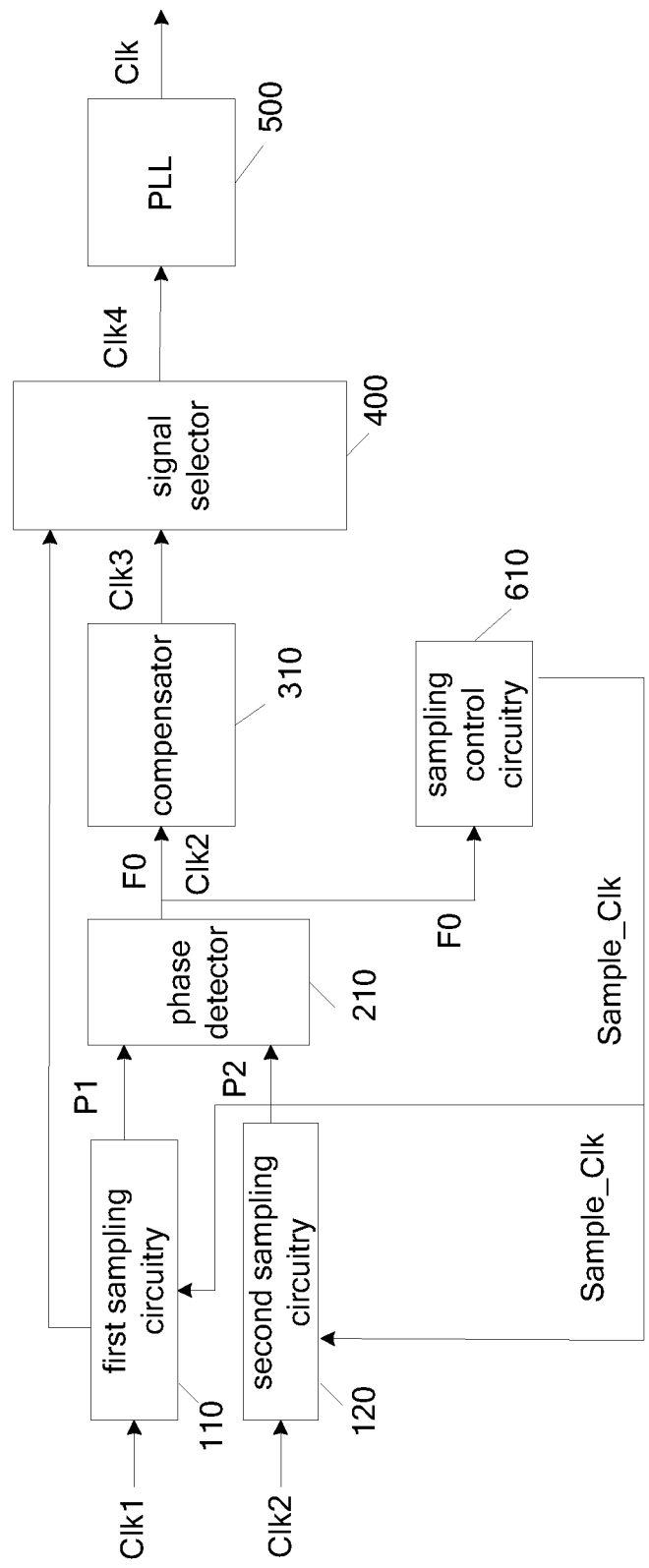
FIG. 3 is a schematic structural diagram of a system for hitless clock switching according to an embodiment of the present disclosure.

In an embodiment based on the embodiment shown in FIG. 2, the phase detector group 200 in the system for hitless clock switching according to the present disclosure includes only one phase detector 210. Correspondingly, the sampling circuitry group 100 includes only one first sampling circuitry 110 and one second sampling circuitry 120, the compensator group 300 includes only one compensator 310, and the sampling control circuitry 600 includes only one sampling control circuitry 610, as shown in FIG. 3.

In this embodiment, the first sampling circuitry 110 samples the primary reference clock signal Clk1 to generate first sampling information P1, the second sampling circuitry 120 samples the secondary reference clock signal Clk2 to generate second sampling information P2, and then the first and second sample information and the secondary reference clock signal Clk2 are sent to the phase detector 210. After receiving the first and second sampling information, the phase detector 210 performs information processing and comparison on the received first and second sampling information to obtain a phase difference F0 between the primary reference clock signal Clk1 and the secondary reference clock signal Clk2. The phase difference F0 and the secondary reference clock signal Clk2 are sent to the compensator 310.

The compensator 310 receives the phase difference F0 and the secondary reference clock signal Clk2 sent by the phase detector 210, and adds the phase difference F0 to the phase of the secondary reference clock signal Clk2 to obtain a backup reference clock signal Clk3 and outputs the backup reference clock signal Clk3 to the signal selector 400.

In the practical application of the present disclosure, the signal selector (for example, a multiplexer) 400 receives the primary reference clock signal Clk1 as well as the backup reference clock signal Clk3 sent by the compensator 310.

When the primary reference clock signal Clk1 is normal, the signal selector 400 selects the primary reference clock signal Clk1 as the target reference clock signal Clk4 from the received primary reference clock signal Clk1 and the backup reference clock signal Clk3, and inputs the selected target reference clock signal Clk4 into the phase-locked loop 500. The phase-locked loop 500 performs loop control on the target reference clock signal Clk4 to generate a clock signal Clk.

When the primary reference clock signal Clk1 is abnormal or missing, it is necessary to switch from the primary reference clock signal Clk1 to the secondary reference clock signal Clk2, the signal selector 400 processes the backup reference clock signal Clk3, which is obtained by the compensator 310 adding the phase difference F0 to the phase of the secondary reference clock signal Clk2, determines the processed backup reference clock signal Clk3 as the target reference clock signal Clk4, and inputs the target reference clock signal Clk4 into the phase-locked loop 500, and loop control is performed by the phase-locked loop 500 on the target reference clock signal Clk4. The phase-locked loop 500 further performs smoothing processing on the target reference clock signal Clk4, and finally outputs the clock signal Clk, which ensures the stability of the output clock signal Clk.

In this embodiment, the phase detector 210 also sends the phase difference F0 to the sampling control circuitry 610. The sampling control circuitry 610 generates a sampling control clock signal Sample_Clk according to the received phase difference F0, and sends the generated sampling control clock signal Sample_Clk to the first sampling circuitry 110 and the second sampling circuitry 120. After receiving the sampling control clock signal Sample_Clk, the first sampling circuitry 110 and the second sampling circuitry 120 respectively sample the primary reference clock signal Clk1 and the secondary reference clock signal Clk2 with the frequency of the sampling control clock signal Sample_Clk as the sampling frequency.

In this embodiment, the frequency of the sampling control clock signal Sample_Clk is known. The sampling control circuitry 610 can obtain by how many clock cycles (i.e., the phase difference) of the sampling control clock signals Sample_Clk are rising edges of the primary reference clock signal Clk1 and the secondary reference clock signal Clk2 away from each other, based on the phase difference F0 from the phase detector 210 and the frequencies of the primary reference clock signal Clk1 and the secondary reference clock signal Clk2. For example, the rising edges are away from each other by N clock cycles, and N is a positive number. The sampling control circuitry 610 can adjust the frequency of the sampling control clock signal Sample_Clk based on the parameter N. For example, the frequency of the adjusted sampling control clock signal Sample_Clk is increased (or reduced) after the adjustment, so that the phase difference between the primary reference clock signal Clk1 and the secondary reference clock signal Clk2 is changed from N to N+1 (or N−1), and the number of cycles of the corresponding sampling control clock signal Sample_Clk at the time of changing from N to N+1 (or N−1) is an accurate phase difference.

As can be seen from the above description, the phase detector 210 obtains the phase difference F0 between the primary reference clock signal Clk1 and the secondary reference clock signal Clk2 according to the first sampling information P1 sent by the first sampling circuitry 110 and the second sampling information P2 sent by the second sampling circuitry 120. The sampling control circuitry 610 sends the sampling control clock signal Sample_Clk to the first sampling circuitry 110 and the second sampling circuitry 120 based on the phase difference F0 from the phase detector 210, so that the first sampling circuitry 110 and the second sampling circuitry 120 use the frequency of the sampling control clock signal Sample_Clk as a sampling frequency to sample. In the present disclosure, the phase detector 210 can be used to obtain an accurate phase difference value, the phase difference-based feedback adjustment is further implemented by the sampling control circuitry 610, and a feedback loop is formed to further ensures the accuracy of the phase difference value outputted by the phase detector 210.

Figure 4:
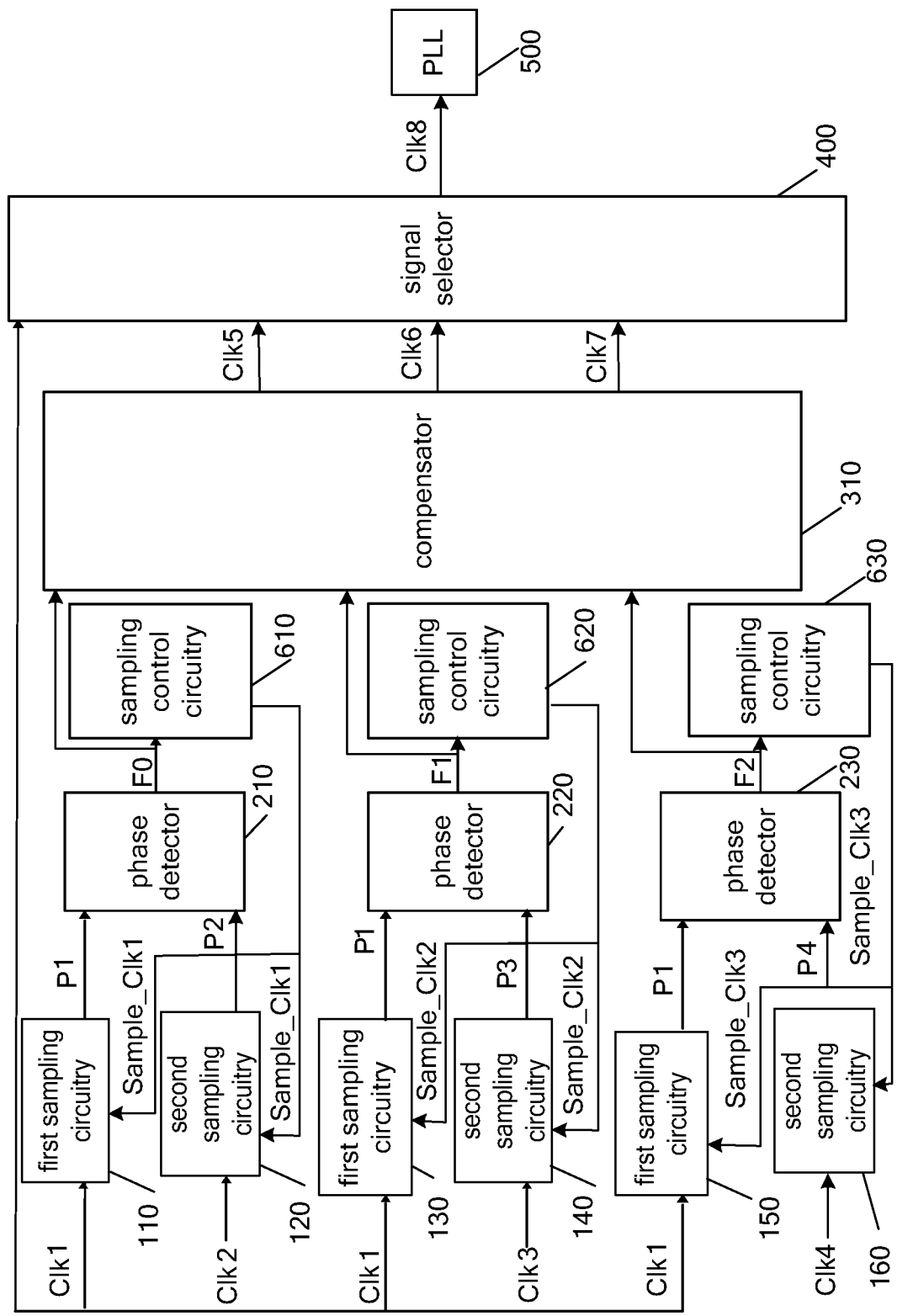
FIG. 4 is a schematic structural diagram of a system for hitless clock switching according to an embodiment of the present disclosure.

In the above embodiment, the phase detector group 200 includes only one phase detector. It can be understood that in other embodiments of the present disclosure, the phase detector group 200 may include multiple phase detectors. In an embodiment based on the embodiment shown in FIG. 2 or 3 above, the phase detector group 200 in the system for hitless clock switching according to the present disclosure includes three phase detectors 210, 220 and 230, as shown in the FIG. 4. Correspondingly, the sampling control circuitry group 600 includes three sampling control circuitries 610, 620 and 630. The sampling circuitry 100 includes three first sampling circuitries 110, 130 and 150 and three second sampling circuitries 120, 140 and 160. The compensator group 300 includes one compensator 310. As shown in FIG. 4, the phase detectors 210, 220 and 230 are connected to the sampling control circuitries 610, 620 and 630 in one-to-one correspondence, the phase detector 210 is connected to the first sampling circuitry 110 and the second sampling circuitry 120, the phase detector 220 is connected to the first sampling circuitry 130 and the second sampling circuitry 140, the phase detector 230 is connected to the first sampling circuitry 150 and the second sampling circuitry 160, and the phase detectors 210, 220 and 230 are connected to the compensator 310.

The first sampling circuitries 110, 130 and 150 sample the primary reference clock signal Clk1 to obtain the first sampling information P1 and send the first sampling information P1 to the phase detectors, and the second sampling circuitries 120, 140 and 160 respectively sample the secondary reference clock signals Clk2, Clk3 and Clk4 to obtain the second sampling information P2, P3 and P4, which are respectively sent to the phase detectors 210, 220 and 230. The phase detector 210 processes the received first sampling information P1 and the second sampling information P2 to obtain a phase difference F0 between the primary reference clock signal Clk1 and the secondary reference clock signal Clk2 and sends the phase difference F0 to the compensator 310, the phase detector 220 processes the received first sampling information P1 and the second sampling information P3 to obtain a phase difference F1 between the primary reference clock signal Clk1 and the secondary reference clock signal Clk3 and sends the phase difference F1 to the compensator 310, and the phase detector 230 processes the received first sampling information P1 and the second sampling information P4 to obtain a phase difference F2 between the primary reference clock signal Clk1 and the secondary reference clock signal Clk4 and sends the phase difference F2 to the compensator 310. Further, the phase detectors 210, 220 and 230 send the secondary reference clock signals Clk2, Clk3 and Clk4 to the compensator 310.

The compensator 310 receives the phase difference F0 and the secondary reference clock signal Clk2 sent by the phase detector 210, the phase difference F1 and the secondary reference clock signal Clk3 sent by the phase detector 220, and the phase difference F2 and the secondary reference clock signal Clk4 sent by the phase detector 230. The compensator 310 adds the phase difference F0 to the phase of the secondary reference clock signal Clk2 to obtain a backup reference clock signal Clk5, adds the phase difference F1 to the phase of the secondary reference clock signal Clk3 to obtain a backup reference clock signal Clk6, and adds the phase difference F2 to the phase of the secondary reference clock signal Clk4 to obtain a backup reference clock signal Clk7. The backup reference clock signals Clk5, Clk6 and Clk7 are sent to the signal selector 400.

When the primary reference clock signal Clk1 is normal, the signal selector 400 selects the primary reference clock signal Clk1 as the target reference clock signal Clk8 from the received primary reference clock signal Clk1 and the backup reference clock signals Clk5, Clk6 and Clk7, and inputs the selected target reference clock signal Clk8 into the phase-locked loop 500. The phase-locked loop 500 performs loop control on the target reference clock signal Clk8 to finally generate a clock signal Clk.

When the primary reference clock signal Clk1 is abnormal or missing, it is necessary to switch from the primary reference clock signal Clk1 to a secondary reference clock signal, the signal selector 400 selects one backup reference clock signal from the backup reference clock signals Clk5, Clk6 and Clk7 (for example, the backup reference signal Clk5 is selected), processes the selected backup reference clock signal and determines the selected backup reference clock signal as the target reference clock signal Clk8. The target reference clock signal Clk8 is inputted into the phase-locked loop 500, and loop control is performed by the phase-locked loop 500 on the target reference clock signal Clk8. The phase-locked loop 500 further performs smoothing processing on the target reference clock signal Clk8, and finally outputs the clock signal Clk, which ensures the stability of the output clock signal Clk.

In this embodiment, the sampling control circuitry 610 is connected to the first sampling circuitry 110 and the second sampling circuitry 120, the sampling control circuitry 620 is connected to the first sampling circuitry 130 and the second sampling circuitry 140, and the sampling control circuitry 630 is connected to the first sampling circuitry 150 and the second sampling circuitry 160. The sampling control circuitries 610, 620 and 630 generate sampling control clock signals Sample_Clk1, Sample_Clk2 and Sample_Clk3 according to the phase differences F0, F1 and F2 from the phase detectors 210, 220 and 230, respectively, and send the sampling control clock signals Sample_Clk1, Sample_Clk2 and Sample_Clk3 to the correspondingly connected first and second sampling circuitries so that the first and second sampling circuitries use the frequency of the corresponding sampling control clock signal as a sampling frequency to sample, as shown in FIG. 4.

Figure 5:
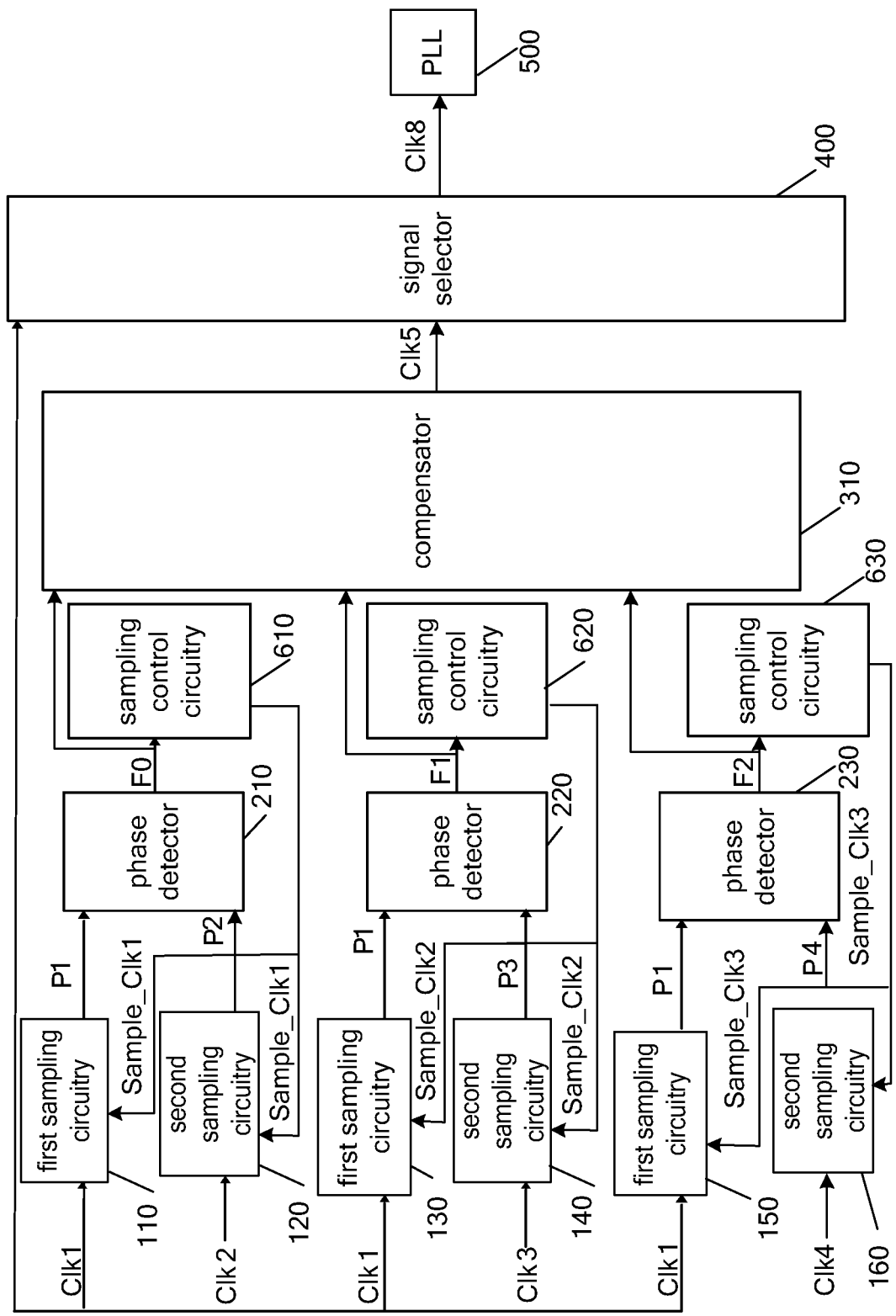
FIG. 5 is a schematic structural diagram of a system for hitless clock switching according to an embodiment of the present disclosure.

It should be noted that, in other embodiments of the present disclosure, the compensator 310 may also perform preliminary selection on the backup reference clock signals. FIG. 5 is a schematic structural diagram of a system for hitless clock switching according to an embodiment of the present disclosure, which basically has the same structure and components as the system for hitless clock switching shown in FIG. 4. The difference therebetween is that the compensator 310 may select one of the generated backup reference clock signals Clk5, Clk6 and Clk7 (for example, the backup reference clock signal Clk5 is selected) as the target reference clock signal Clk8, and input the target reference clock signal Clk8 into the phase-locked loop 500 for loop. The phase-locked loop 500 further performs smoothing processing on the target reference clock signal Clk8, and finally outputs the clock signal Clk, which ensures the stability of the output clock signal Clk.

In the above embodiments, the system for hitless clock switching includes the sampling control circuitry. It is understood that the above embodiments are merely preferred embodiments of the present disclosure, and do not constitute any limitation to the present disclosure. In other embodiments of the present disclosure, the system for hitless clock switching does not include a sampling control circuitry, and those skilled in the art may improvise as needed.

Figure 6:
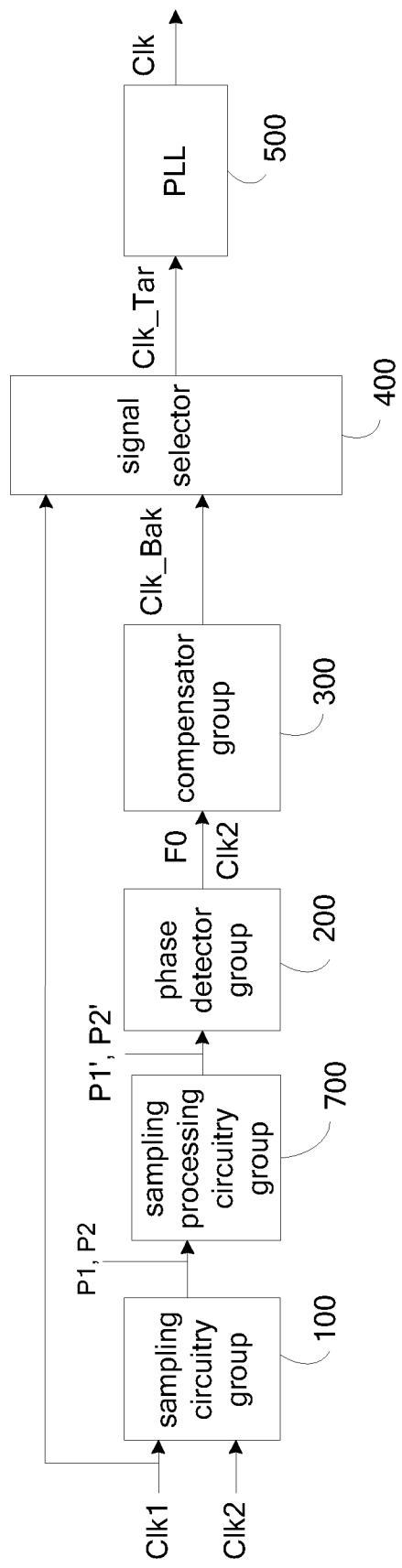
FIG. 6 is a schematic structural diagram of a system for hitless clock switching according to an embodiment of the present disclosure.

Based on the embodiment shown in FIG. 1, a system for hitless clock switching is provided in an embodiment of the present disclosure. As shown in FIG. 6, the system for hitless clock switching includes a sampling circuitry group 100, a sampling processing circuitry group 700, a phase detector group 200, a compensator group 300, a signal selector 400, and a phase-locked loop 500, which are sequentially connected. The sampling processing circuitry group 700 includes at least one first sampling processing circuitry and at least one second sampling processing circuitry, and the first and second sampling processing circuitries are respectively connected in one-to-one correspondence with the first and second sampling circuitries in the sampling circuitry group. The sampling processing circuitry group 700 is configured to process the first and second sampling information P1, P2 obtained by the sampling circuitry group 100 based on an averaging algorithm, to respectively obtain third and fourth sampling information P1', P2', and send the third and fourth sampling information P1', P2' to the phase detector group 200, so that the phase detector group 200 obtains the phase difference F0 between the primary reference clock signal Clk1 and the secondary reference clock signal Clk2 based on the third and fourth sampling information, thus the obtained phase difference can be made more accurate. The functions of the compensator group 300, the signal selector 400 and the phase-locked loop 500 in this embodiment are the same as those of the corresponding components in the embodiment shown in FIG. 1, and therefore will not be described again.

Figure 7:
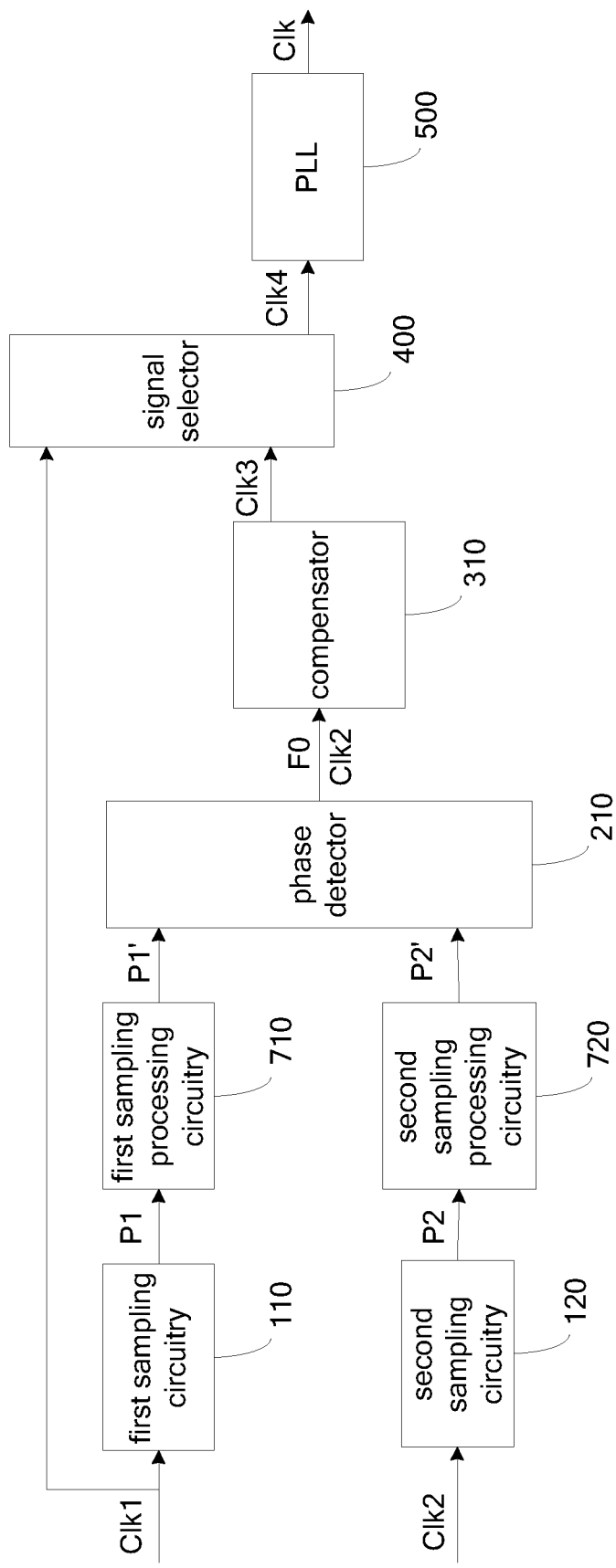
FIG. 7 is a schematic structural diagram of a system for hitless clock switching according to an embodiment of the present disclosure.

The system for hitless clock switching shown in FIG. 6 will be described in detail below by taking the phase detector group 200 including only one phase detector as an example. In an embodiment of the present disclosure, the phase detector group 200 includes only one phase detector 210, and the compensator group 300 includes only one compensator 310. The sampling circuitry group 100 includes only one first sampling circuitry 110 and one second sampling circuitry 120. The sampling processing circuitry group 700 includes only one first sampling processing circuitry 710 and one second sampling processing circuitry 720. The first and second sampling processing circuitries are respectively connected to the first and second sampling circuitries in one-to-one correspondence, and the phase detector 210 is connected to the first and second sampling processing circuitries, as shown in FIG. 7.

The first sampling circuitry 110 and the second sampling circuitry 120 respectively sample the primary reference clock signal Clk1 and the secondary reference clock signal Clk2 to obtain the first sampling information P1 and the second sampling information P2, and respectively send the first sampling information P1 and the second sampling information P2 to the first sampling processing circuitry 710 and the second sampling processing circuitry 720. The first sampling processing circuitry 710 and the second sampling processing circuitry 720 respectively process the first sampling information P1 and the second sampling information P2 based on the averaging algorithm to obtain the third sampling information P1' and the fourth sampling information P2', and send the third sampling information P1' and the fourth sampling information P2' to the phase detector 210. The averaging algorithm includes, for example, removing the maximum value and the minimum value of the received multiple pieces of sampling information, and obtaining an average value of the remaining pieces of sampling information. The present disclosure does not limit the specific implementation method of the averaging algorithm.

After receiving the third and fourth sampling information, the phase detector 210 performs information processing and comparison on the received third and fourth sampling information to obtain a phase difference F0 between the primary reference clock signal Clk1 and the secondary reference clock signal Clk2, and sends the phase difference F0 and the secondary reference clock signal Clk2 to the compensator 310.

The compensator circuitry 310 receives the phase difference F0 and the secondary reference clock signal Clk2 sent by the phase detector 210, adds the phase difference F0 to the phase of the secondary reference clock signal Clk2 to obtain a backup reference clock signal Clk3 and outputs the backup reference clock signal Clk3 to the signal selector 400.

In the practical application of the present disclosure, the signal selector (for example, multiplexer) 400 receives the primary reference clock signal Clk1 as well as the backup reference clock signal Clk3 sent by the compensator 310.

When the primary reference clock signal Clk1 is normal, the signal selector 400 selects the primary reference clock signal Clk1 as the target reference clock signal Clk4 from the received primary reference clock signal Clk1 and the backup reference clock signal Clk3, and inputs the selected target reference clock signal Clk4 into the phase-locked loop 500. The phase-locked loop 500 performs loop control on the target reference clock signal Clk4 to generate a clock signal Clk.

When the primary reference clock signal Clk1 is abnormal or missing, it is necessary to switch from the primary reference clock signal Clk1 to the secondary reference clock signal Clk2, the signal selector 400 processes the backup reference clock signal Clk3, which is obtained by the compensator 310 adding the phase difference F0 to the phase of the secondary reference clock signal Clk2, and determines the processed backup reference clock signal Clk3 as the target reference clock signal Clk4, and inputs the target reference clock signal Clk4 into the phase-locked loop 500, and loop control is performed by the phase-locked loop 500 on the target reference clock signal Clk4. The phase-locked loop 500 further performs smoothing processing on the target reference clock signal Clk4, and finally outputs the clock signal Clk, which ensures the stability of the output clock signal Clk.

In the above embodiment, the phase detector group 200 includes only one phase detector. It can be understood that, in other embodiments of the application, the phase detector group 200 may also include multiple phase detectors. When the phase detector group 200 includes at least two phase detectors, the sampling circuitry group 100 includes at least two second sampling circuitries, and the sampling processing circuitry group 700 includes at least two second sampling processing circuitries. The numbers of the phase detectors, the second sampling circuitries and the second sampling processing circuitries are the same, and the phase detectors, the second sampling circuitries and the second sampling processing circuitries are connected in one-to-one correspondence, where each second sampling circuitry samples a secondary reference clock signal. Since in the present disclosure, the primary reference clock signals in different sets of reference clock signals are the same and the secondary reference clock signals in different sets of reference clock signals are different, the numbers of the first sampling circuitries and the first sampling processing circuitries may be less than the number of phase detectors, that is, the sampling circuitry group 100 includes at least one first sampling circuitry, the sampling processing circuitry group 700 includes at least one first sampling processing circuitry, and the first sampling circuitry and the first sampling processing circuitry are connected in one-to-one correspondence. Each phase detector is connected to only one first sampling processing circuitry and one second sampling processing circuitry, and each first sampling processing circuitry is connected to at least one phase detector. A person skilled in the art can make proper connections between the components according to the numbers of the phase detectors and the first sampling circuitries, which is not limited in the present disclosure.

Figure 8:
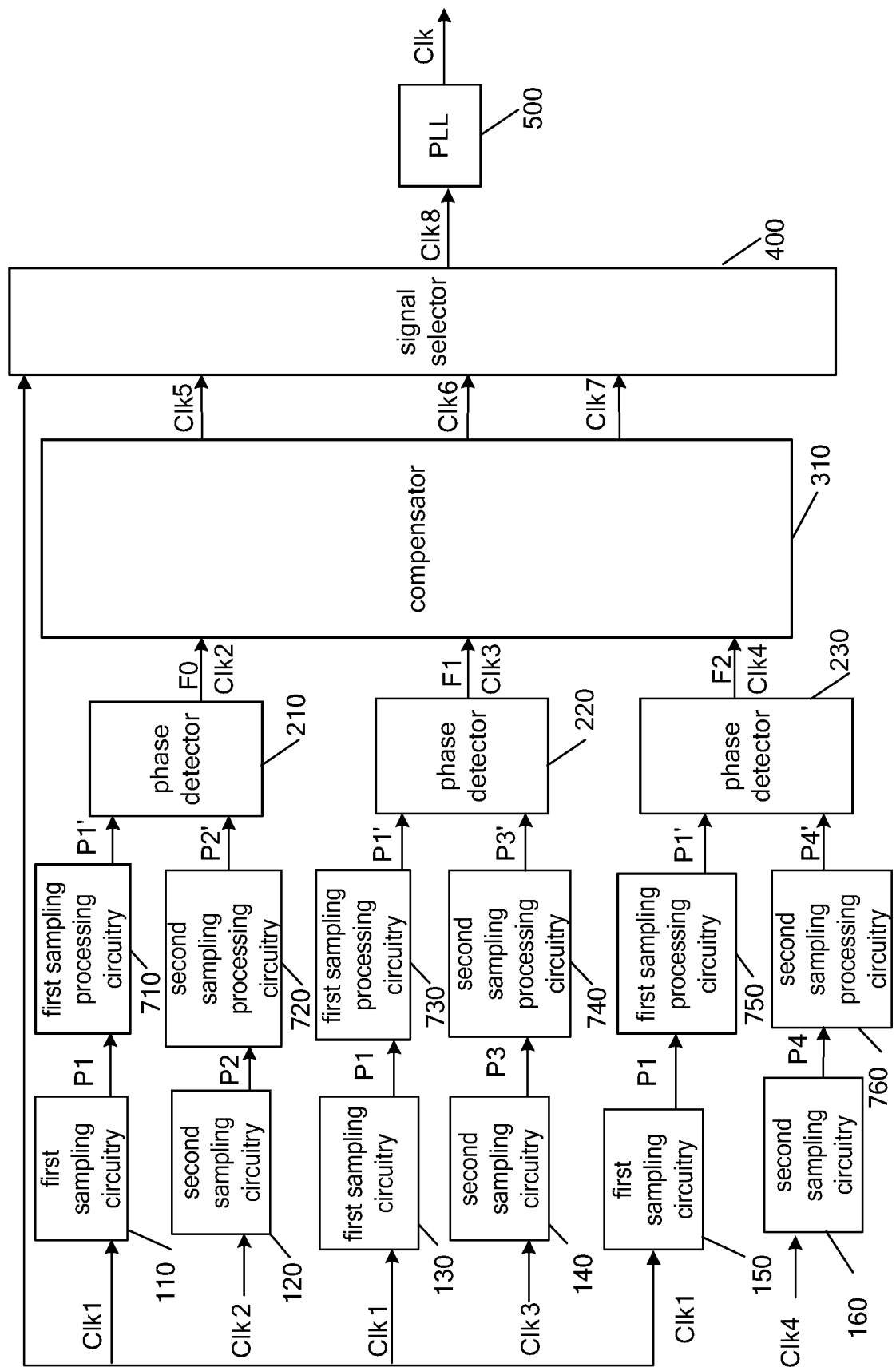
FIG. 8 is a schematic structural diagram of a system for hitless clock switching according to an embodiment of the present disclosure.

Specifically, in an embodiment based on the above embodiments shown in FIG. 6 or 7, the phase detector group 200 in the system for hitless clock switching according to the present disclosure includes three phase detectors 210, 220 and 230, as shown in FIG. 8. Accordingly, the sampling circuitry group includes three first sampling circuitries 110, 130 and 150 and three second sampling circuitries 120, 140 and 160. The sampling processing circuitry group includes three first sampling processing circuitries 710, 730 and 750 and three second sampling processing circuitries 720, 740 and 760. The compensator group 300 includes one compensator 310 connected to the phase detectors 210, 220 and 230. The first and second sampling processing circuitries are respectively connected to the first sampling circuitry and the second sampling circuitry in one-to-one correspondence, and are connected to corresponding phase detectors. For example, the phase detector 210 is connected to the first sampling processing circuitry 710 and the second sampling processing circuitry 720, and the first sampling processing circuitry 710 and the second sampling processing circuitry 720 are connected in one-to-one correspondence with the first sampling circuitry 110 and the second sampling circuitry 120. Other phase detectors are connected in a similar manner, which therefore will not be described again. The first sampling circuitries 110, 130 and 150 sample the primary reference clock signal Clk1 to obtain the first sampling information P1 and respectively send it to the first sampling processing circuitries 710, 730 and 750. The second sampling circuitries 120, 140 and 160 respectively sample the secondary reference clock signals Clk2, Clk3 and Clk4 to obtain second sampling information P2, P3 and P4 and send them to the second sampling processing circuitries 720, 740 and 760, respectively. The first sampling processing circuitries 710, 730 and 750 process the received first sampling information P1 based on an averaging algorithm to obtain third sampling information P1' and send the third sampling information P1' to the phase detectors 210, 220 and 230, respectively. The second sampling processing circuitries 720, 740 and 760 process the received second sampling information P2, P3 and P4 based on the averaging algorithm to obtain fourth sampling information P2', P3' and P4' and send the fourth sampling information P2', P3' and P4' to the phase detectors 210, 220 and 230, respectively. The phase detectors 210, 220 and 230 process and compare the received third sampling information P1' and fourth sampling information P2', P3' and P4' to obtain phase differences F0, F1 and F2 between the primary reference clock signal Clk1 and the secondary reference clock signals Clk2, Clk3 and Clk4 respectively, and sends the phase differences F0, F1 and F2 to the compensator 310. The phase detectors 210, 220 and 230 also send the secondary reference clock signals Clk2, Clk3 and Clk4 to the compensator 310, respectively.

The compensator 310 receives the phase difference F0 and the secondary reference clock signal Clk2 sent by the phase detector 210, the phase difference F1 and the secondary reference clock signal Clk3 sent by the phase detector 220, and the phase difference F2 and the secondary reference clock signal Clk4 sent by the phase detector 230. The compensator 310 adds the phase difference F0 to the phase of the secondary reference clock signal Clk2 to obtain a backup reference clock signal Clk5, adds the phase difference F1 to the phase of the secondary reference clock signal Clk3 to obtain a backup reference clock signal Clk6, adds the phase difference F2 to the phase of the secondary reference clock signal Clk4 to obtain a backup reference clock signal Clk7, and sends the backup reference clock signals Clk5, Clk6 and Clk7 to the signal selector 400.

When the primary reference clock signal Clk1 is normal, the signal selector 400 selects the primary reference clock signal Clk1 as the target reference clock signal Clk8 from the received primary reference clock signal Clk1 and the backup reference clock signals Clk5, Clk6 and Clk7, and inputs the selected target reference clock signal Clk8 into the phase-locked loop 500. The phase-locked loop 500 performs loop control on the target reference clock signal Clk8 to finally generate a clock signal Clk.

When the primary reference clock signal Clk1 is abnormal or missing, it is necessary to switch from the primary reference clock signal Clk1 to a secondary reference clock signal, the signal selector 400 selects one backup reference clock signal from the backup reference clock signals Clk5, Clk6 and Clk7 (for example, the backup reference signal Clk5 is selected), processes the selected backup reference clock signal, determines the processed selected backup reference clock signal as the target reference clock signal Clk8, and inputs the target reference clock signal Clk8 into the phase-locked loop 500, and loop control is performed by the phase-locked loop 500 on the target reference clock signal Clk8. The phase-locked loop 500 further performs smoothing processing on the target reference clock signal Clk8, and finally outputs the clock signal Clk, which ensures the stability of the output clock signal Clk.

Figure 9:
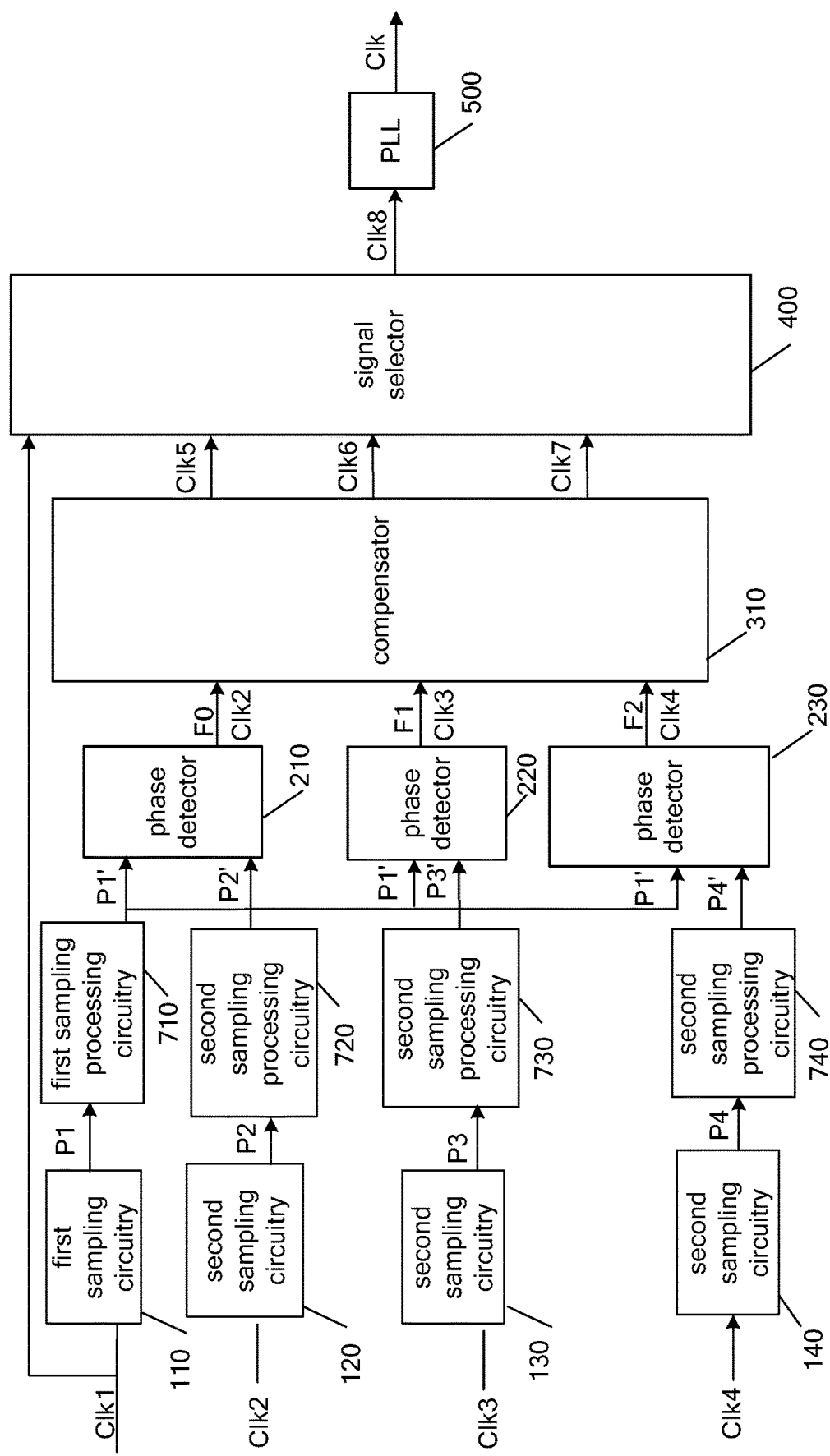
FIG. 9 is a schematic structural diagram of a system for hitless clock switching according to an embodiment of the present disclosure.

In order to simplify the system for hitless clock switching according to the above embodiments, as shown in FIG. 9, the sampling processing circuitry group 700 may include only one first sampling processing circuitry 710. Accordingly, the sampling circuitry group 100 includes only one first sampling circuitry 110. The first sampling circuitry 110 is connected to the first sampling processing circuitry 710, and the first sampling processing circuitry 710 is connected to the phase detectors 210, 220 and 230. The first sampling processing circuitry 710 processes the first sampling information P1 sent by the first sampling circuitry 110 to obtain the third sampling information P1' based on the averaging algorithm, and sends the obtained third sampling information P1' to the phase detector 210, 220 and 230. The phase detectors 210, 220 and 230 process and compare the received first sampling information P1' and the fourth sampling information P2', P3' and P4' to obtain phase differences F0, F1 and F2 between the primary reference clock signal Clk1 and the secondary reference clock signals Clk2, Clk3 and Clk4 respectively, and send the phase differences F0, F1 and F2 to the compensator 310.

The second sampling circuitries 120, 130 and 140, the second sampling processing circuitries 720, 730 and 740, the compensator 310, the signal selector 400 and the phase-locked loop 500 in FIG. 9 are connected in the same manner and have same functions as the corresponding components in the embodiment shown in FIG. 8, which therefore are not described herein again.

Figure 10:
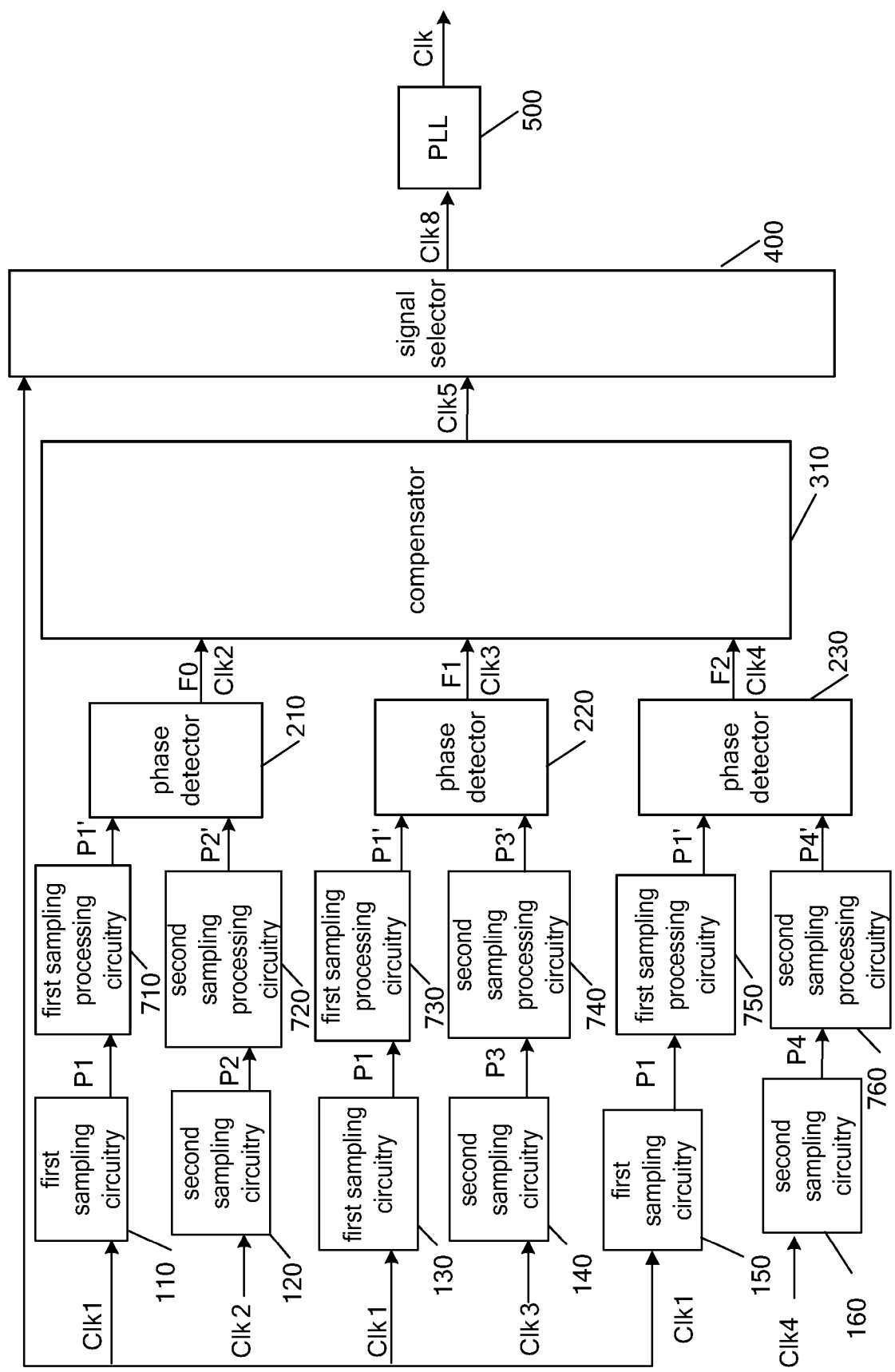
FIG. 10 is a schematic structural diagram of a system for hitless clock switching according to an embodiment of the present disclosure.

It should be noted that, in other embodiments of the present disclosure, the compensator 310 may also perform preliminary selection on the backup reference clock signals. FIG. 10 is a schematic structural diagram of a system for hitless clock switching according to an embodiment of the present disclosure, which basically has the same structure and components as the system for hitless clock switching shown in FIG. 8. The difference therebetween is that the compensator 310 may select one of the generated backup reference clock signals Clk5, Clk6 and Clk7 (for example, the backup reference clock signal Clk5 is selected) as the target reference clock signal Clk8, and input the target reference clock signal Clk8 into the phase-locked loop 500 for loop control. The phase-locked loop 500 further performs smoothing processing on the target reference clock signal Clk8, and finally outputs the clock signal Clk, which ensures the stability of the output clock signal Clk.

In the above embodiments, the compensator group 300 includes only one compensator. It can be understood that the compensator group 300 can also include multiple compensators. The number of the compensators may be less than, equal to or greater than the number of the phase detectors. Each phase detector is connected to one compensator, some compensator may be connected to no phase detector, or one compensator may be connected to one or more phase detectors. The connection relationship between compensators and phase detectors will be described below in conjunction with some embodiments, which applies to not only the system for hitless clock switching with the sampling control circuitry group according to some embodiments of the present disclosure but also the system for hitless clock switching with the sampling processing circuitry group according to some embodiments of the present disclosure.

Figure 11:
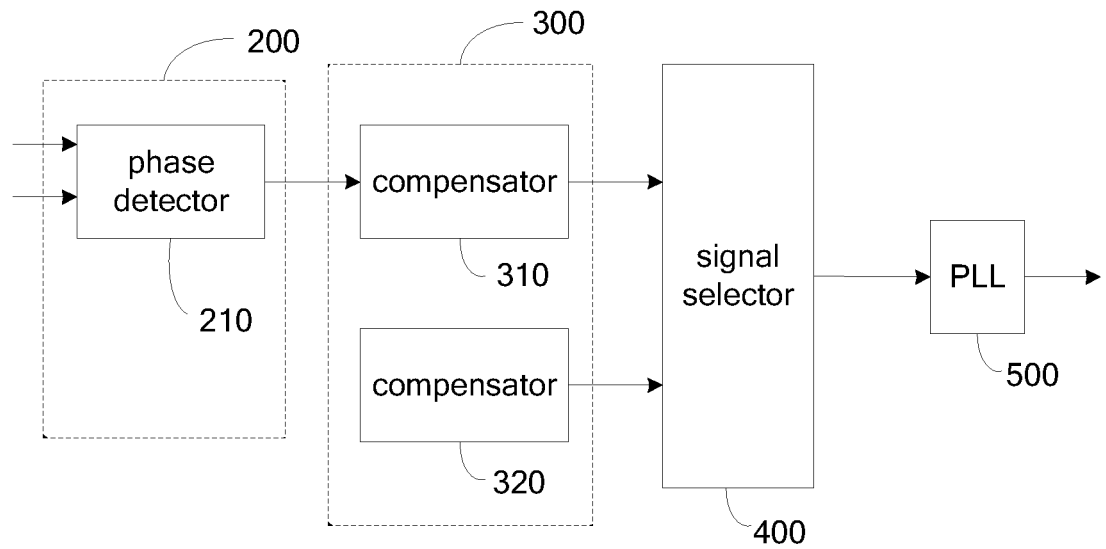
FIG. 11 is a partial structural diagram of a system for hitless clock switching according to an embodiment of the present disclosure.

In an embodiment, the phase detector group includes only one phase detector, the c group includes only one compensator, and the phase detector is connected to the compensator. Or the compensator group includes at least two compensators. In this case, the number of the compensators is greater than the number of the phase detector, so only one compensator is connected to the phase detector, and the other compensators are in an idle state. For example, as shown in FIG. 11, the phase detector group 200 includes only one phase detector 210, and the compensator group 300 includes two compensators 310 and 320, where the phase detector 210 is connected to the compensator 310 while the compensator 320 is in the idle state.

It should be noted that the compensator in the idle state in this embodiment is not put into operation in the application process of this embodiment. However, in practical application, sometimes it is necessary to add at least one set of reference clock signals. In this case, it is necessary to add corresponding phase detectors and compensators in the existing system for hitless clock switching. From the perspective of the overall structure of the system for hitless clock switching, adding the corresponding phase detectors and compensators involves more circuit structural modifications and complicated operations. In the present disclosure, since there is an idle compensator, phase compensation on the added at least one set of reference clock signals can be realized by merely adding a corresponding phase detector and connecting the phase detector to the compensator in the idle state, without significantly modifying the circuit structure of the system for hitless clock switching, thereby simplifying the modification operations.

Figure 12:
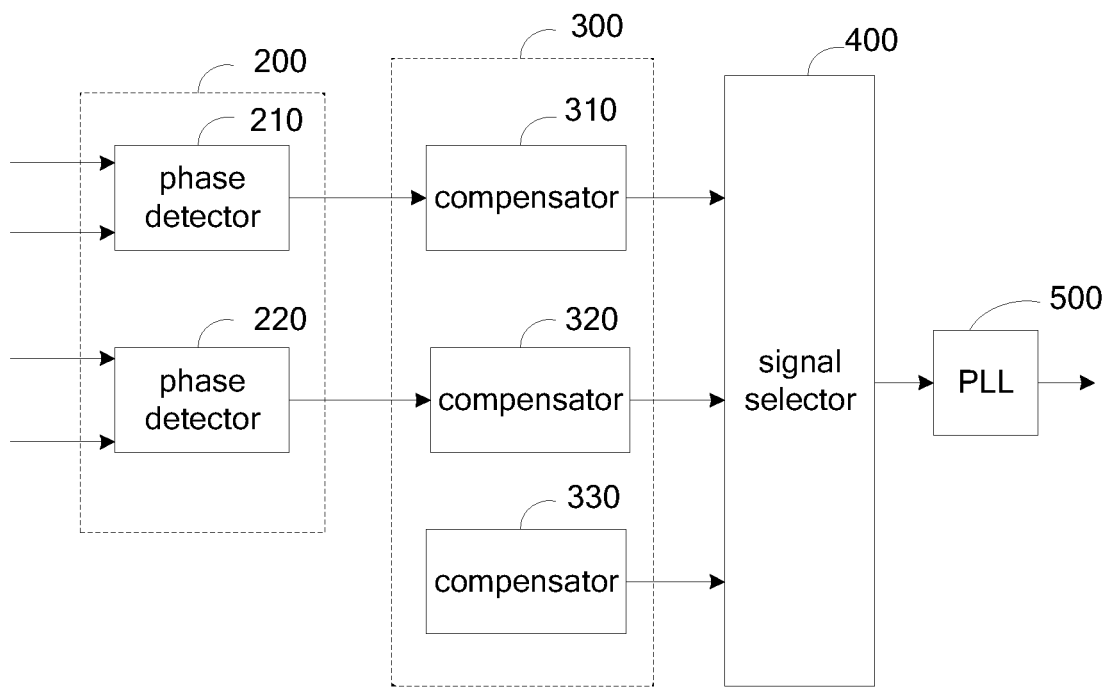
FIG. 12 is a partial structural diagram of a system for hitless clock switching according to an embodiment of the present disclosure.

In an embodiment, the phase detector group includes at least two phase detectors, the compensator group includes at least two compensators, and the number of the phase detectors is less than the number of the compensators, where one phase detector is connected to only one compensators. For example, as shown in FIG. 12, the phase detector group 200 includes two phase detectors 210 and 220. The compensator group 300 includes three compensators 310, 320 and 330. The phase detector 210 is connected to the compensator 310, and the phase detector 220 is connected to the compensator 320. In this embodiment, the compensator 330 is in an idle state, and the technical effects and benefits of setting the idle compensators have been described in detail in the above embodiment, and therefore will not be described again.

Figure 13:
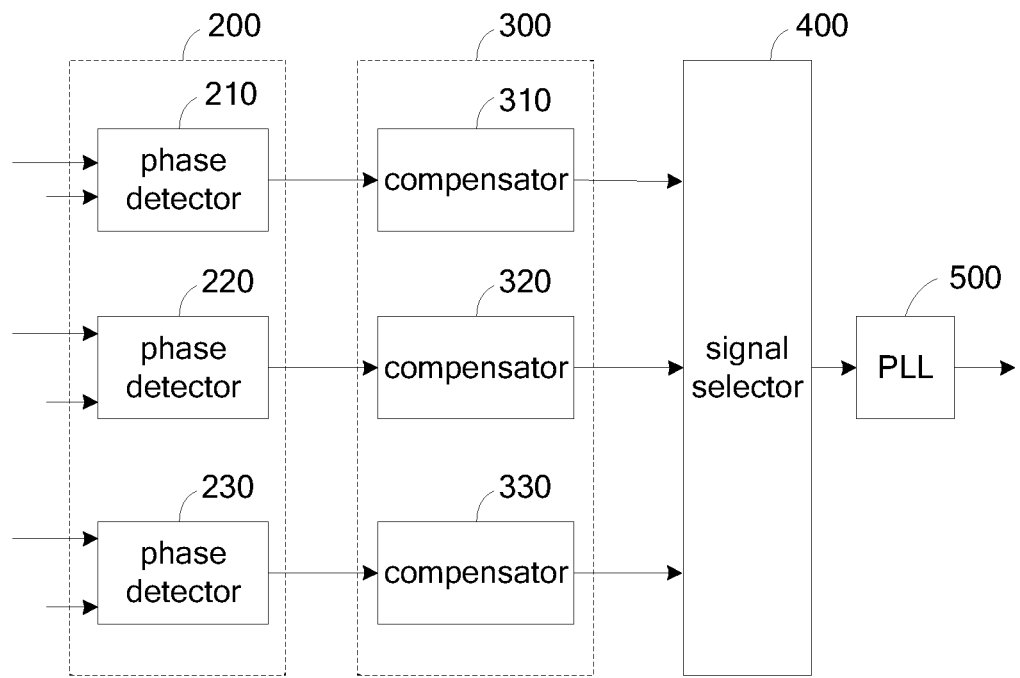
FIG. 13 is a partial structural diagram of a system for hitless clock switching according to an embodiment of the present disclosure.

In an embodiment, the phase detector group includes at least two phase detectors, the compensator group includes at least two compensators, and the number of the phase detectors is equal to the number of the compensators. Preferably, the phase detectors are connected to the compensators in one-to-one correspondence. For example, as shown in FIG. 13, the phase detector group 200 includes three phase detectors 210, 220 and 230. The compensator group 300 includes three compensators 310, 320 and 330. The phase detector 210 is connected to the compensator 310, the phase detector 220 is connected to the compensator 320, and the phase detector 230 is connected to the compensator 330. It should be noted that although the number of the phase detectors in this embodiment is equal to the number of the compensators, the phase detectors and the compensator may be not connected one to one. For example, the phase detectors 210 and 220 may be both connected to the compensator 310, and the phase detector 230 is connected to the compensator 320, and thus the compensator 330 is in an idle state.

Figure 14:
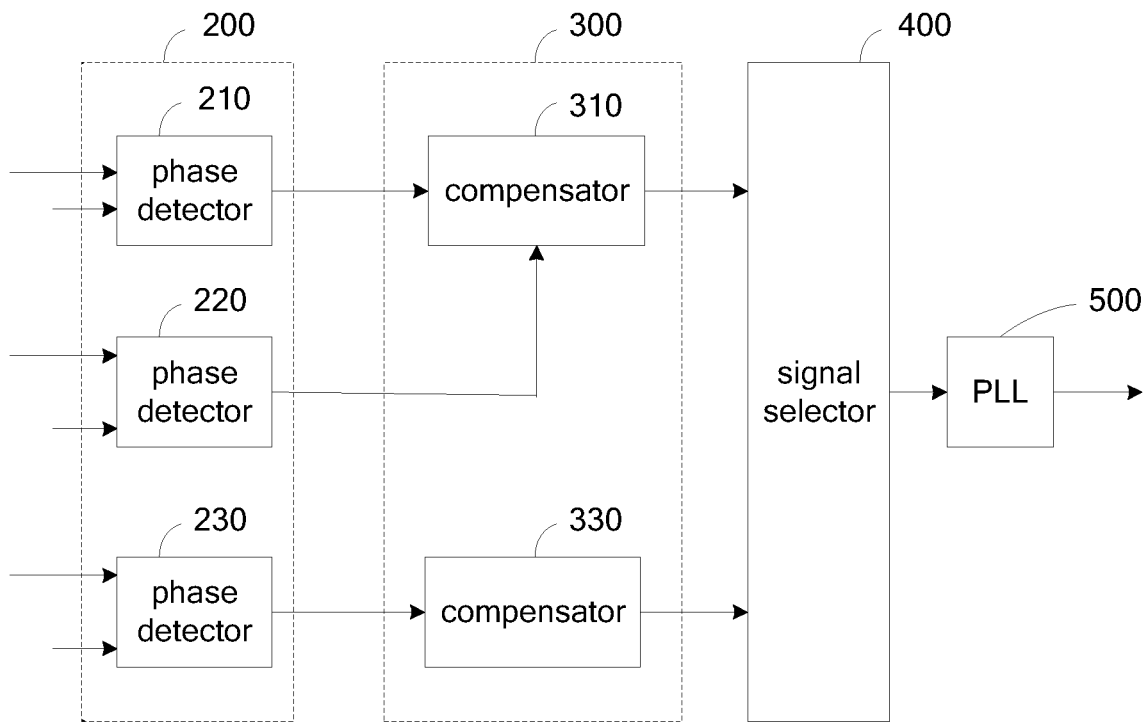
FIG. 14 is a partial structural diagram of a system for hitless clock switching according to an embodiment of the present disclosure.

In an embodiment, the phase detector group includes at least two phase detectors, the compensator group includes at least two compensator, and the number of the phase detectors is greater than the number of the compensators, where one phase detector is connected to only one compensator. For example, as shown in FIG. 14, the phase detector group 200 includes three phase detectors 210, 220 and 230. The compensator group 300 includes two compensators 310 and 320. The phase detector 210 and the phase detector 220 are both connected to the compensator 310, and the phase detector 230 is connected to the compensator 320. It should be noted that, in this embodiment, there may be a compensator in an idle state, i.e., connected to no phase detector. For example, the phase detectors 210, 220, and 230 are all connected to the compensator 310, and thus the compensator 320 is in an idle state.

It should be noted that, in order to more prominently show different connection relationships of the phase detectors and the compensators, FIGS. 11 to 14 only show some components of the system for hitless clock switching, and other components, such as a sampling circuitry group, a sampling control circuitry group and a sampling processing circuitry group, are not shown because these omitted components do not affect the connection relationship between the phase detectors and the compensators. It can be understood that those skilled in the art can obtain the system for hitless clock switching including the connection relationships shown in FIGS. 11 to 14 by combining the connection relationships shown in FIGS. 11 to 14 with the description in other parts of the present disclosure. For purpose of conciseness, the systems such obtained are not enumerated in the present disclosure.

Figure 15:
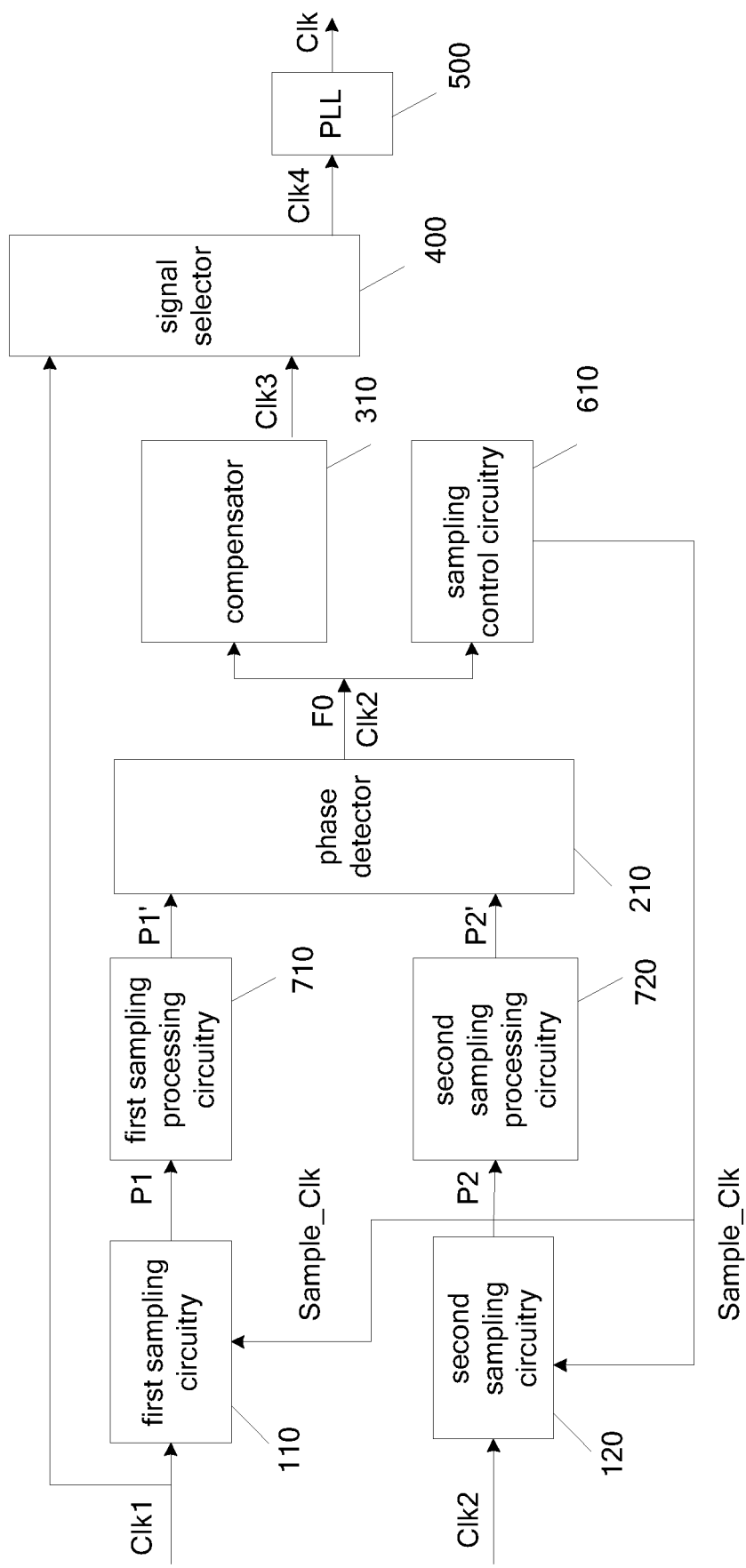
FIG. 15 is a schematic structural diagram of a system for hitless clock switching according to an embodiment of the present disclosure.

In the above embodiment, the system for hitless clock switching includes a sampling control circuitry group 600 or a sampling processing circuitry group 700, so that the phase detector group can obtain a more accurate phase difference. In an embodiment of the present disclosure, the system for hitless clock switching may include both the sampling control circuitry group 600 and the sampling processing circuitry group 700. Such system will be described in detail below by taking the phase detector group 200 including only one phase detector as an example. As shown in FIG. 15, the phase detector group 200 includes only one phase detector 210, and the compensator group 300 includes only one compensator 310. The sampling circuitry group 100 includes only one first sampling circuitry 110 and one second sampling circuitry. 120. The sampling control circuitry group 700 includes only one first sampling processing circuitry 710 and one second sampling processing circuitry 720. The first and second sampling processing circuitries are respectively connected to the first and second sampling circuitries in one-to-one correspondence, and the phase detector 210 is connected to the first and second sampling processing circuitries. The sampling control circuitry group 600 includes one sampling control circuitry 610 which is connected to the phase detector 210 and the first and second sampling circuitries 110 and 120.

The first sampling circuitry 110 and the second sampling circuitry 120 respectively sample the primary reference clock signal Clk1 and the secondary reference clock signal Clk2 to obtain the first sampling information P1 and the second sampling information P2, and respectively send the first sampling information P1 and the second sampling information P2 to the first sampling processing circuitry 710 and the second sampling processing circuitry 720. The first sampling processing circuitry 710 and the second sampling processing circuitry 720 respectively process the first sampling information P1 and the second sampling information P2 based on the averaging algorithm to obtain the third sampling information P1' and the fourth sampling information P2', and send the third sampling information P1' and the fourth sampling information P2' to the phase detector 210. The averaging algorithm includes, for example, removing the maximum value and the minimum value of the received multiple pieces of sampling information, and obtaining an average value of the remaining pieces of sampling information. The present disclosure does not limit the specific implementation method of the averaging algorithm.

After receiving the third and fourth sampling information, the phase detector 210 performs information processing and comparison on the received third and fourth sampling information to obtain a phase difference F0 between the primary reference clock signal Clk1 and the secondary reference clock signal Clk2, sends the phase difference F0 to the sampling control circuitry 610 and sends the phase difference F0 and the secondary reference clock signal Clk2 to the compensator 310.

The compensator 310 receives the phase difference F0 and the secondary reference clock signal Clk2 sent by the phase detector 210, adds the phase difference F0 to the phase of the secondary reference clock signal Clk2 to obtain a backup reference clock signal Clk3 and outputs the backup reference clock signal Clk3 to the signal selector 400.

Further, the sampling control circuitry 610 generates a sampling control clock signal Sample_Clk according to the received phase difference F0, and sends the generated sampling control clock signal Sample_Clk to the first sampling circuitry 110 and the second sampling circuitry 120. After receiving the sampling control clock signal Sample_Clk, the first sampling circuitry 110 and the second sampling circuitry 120 sample the primary reference clock signal Clk1 and the secondary reference clock signal Clk2 with the frequency of the sampling control clock signal Sample_Clk as the sampling frequency. Reference can be made to the specific description in the embodiment shown in Figure for the process of the sampling control circuitry 610 controlling the first and second sampling circuitries 110 and 120 to use the frequency of the sampling control clock signal as a sampling frequency to sample and obtaining an accurate phase difference, which will not be repeated here.

In this embodiment, by providing both the sampling control circuitry group 600 and the sampling processing circuitry group 700 in the system for hitless clock switching, the phase detector can obtain a more accurate phase difference, thereby improving the accuracy of clock switching. In this embodiment, the phase detector group includes only one phase detector. It can be understood that in other embodiments of the present disclosure, the phase detector group may include multiple phase detectors. When the phase detector group includes multiple phase detectors, the sampling control circuitry group and the sampling processing circuitry group may respectively include a corresponding number of sampling control circuitries and a corresponding number of sampling processing circuitries with reference to the description in the above embodiments, and the components are connected accordingly. A person skilled in the art can reasonably combine the system for hitless clock switching including the sampling control circuitry group and the system for hitless clock switching including the sampling processing circuitry group in the above embodiments to obtain the system for hitless clock switching in which the phase detector group includes multiple phase detectors and both the sampling control circuitry group and the sampling processing circuitry group are included. The system for hitless clock switching thus obtained should also fall within the protection scope of the present disclosure.

In the above various embodiments, each compensator in the compensator 300 is always in an active state to receive a phase differences and a secondary reference clock signal from a corresponding phase detector and perform phase compensation by adding the phase different to the phase of the secondary reference clock signal, regardless of whether the current primary reference clock signal is normal or abnormal or missing.

Therefore, when the primary reference clock signal is normal, the compensator still performs the phase compensation operation, which causes a waste of resources to the system for hitless clock switching.

Figure 16:
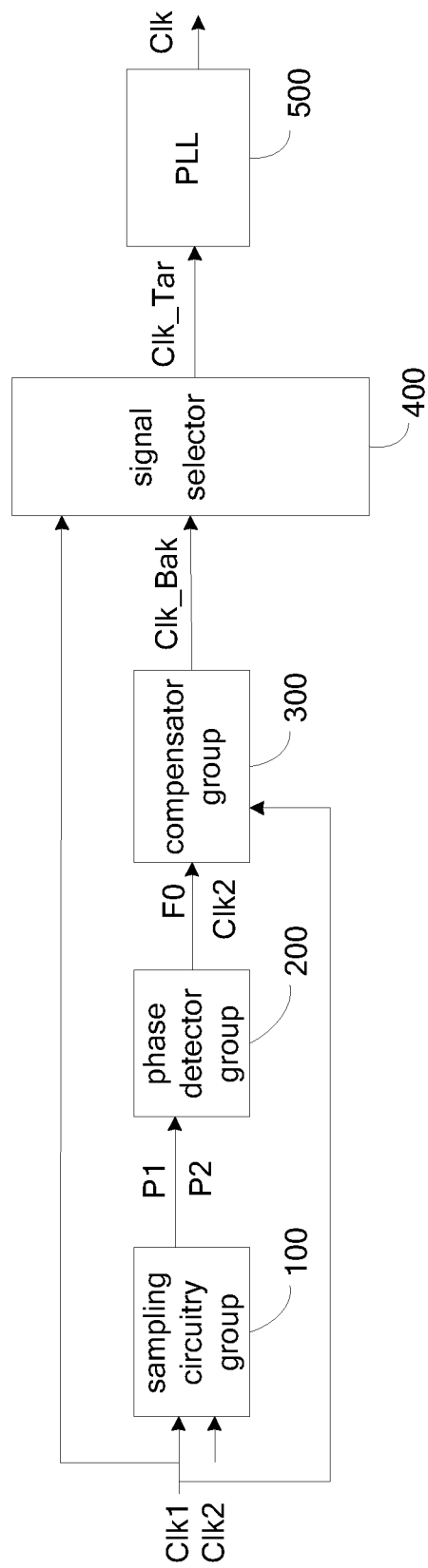
FIG. 16 is a schematic structural diagram of a system for hitless clock switching according to an embodiment of the present disclosure.
Figure 17:
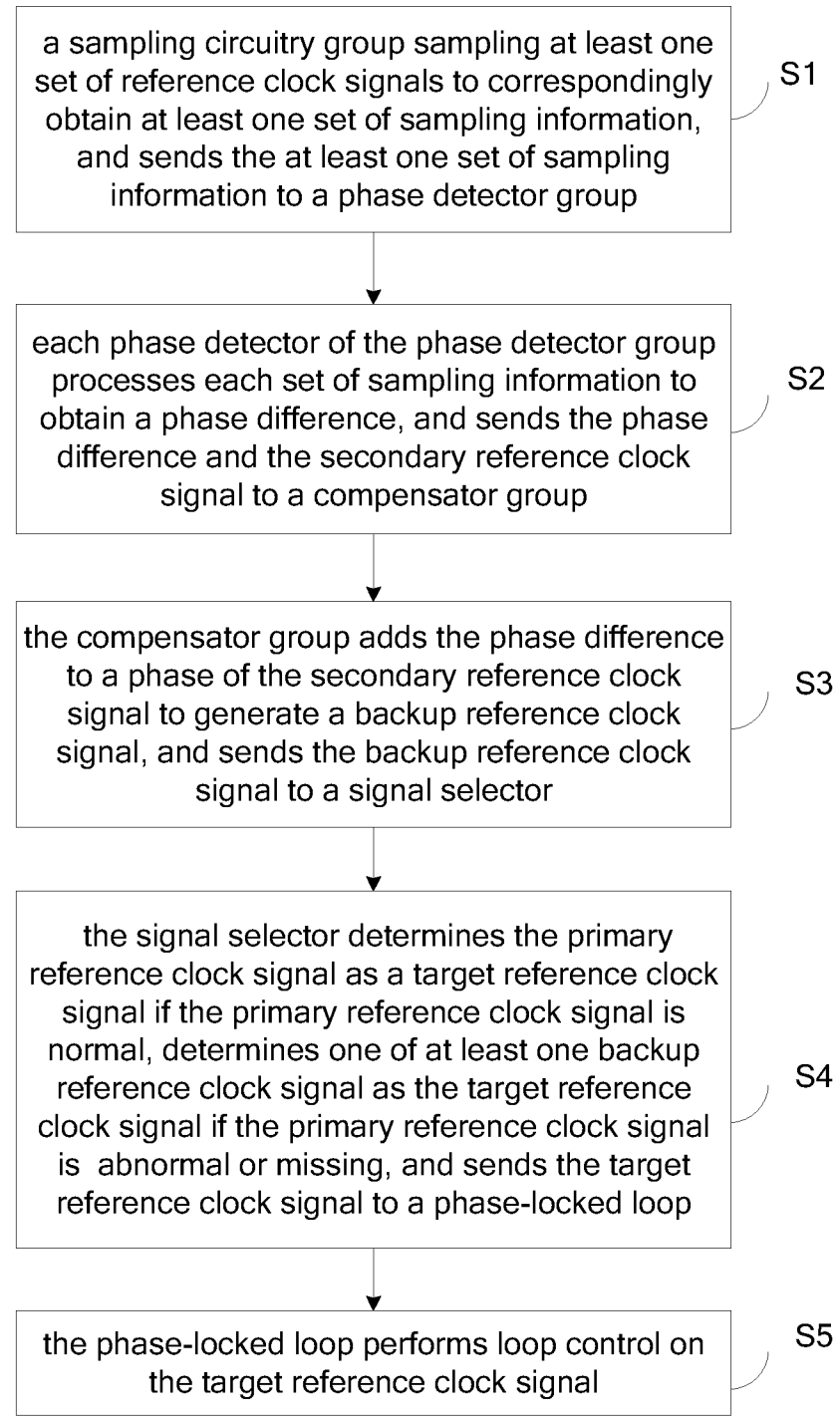
FIG. 17 is a flowchart of a method for hitless clock switching according to an embodiment of the present disclosure.
Figure 18:
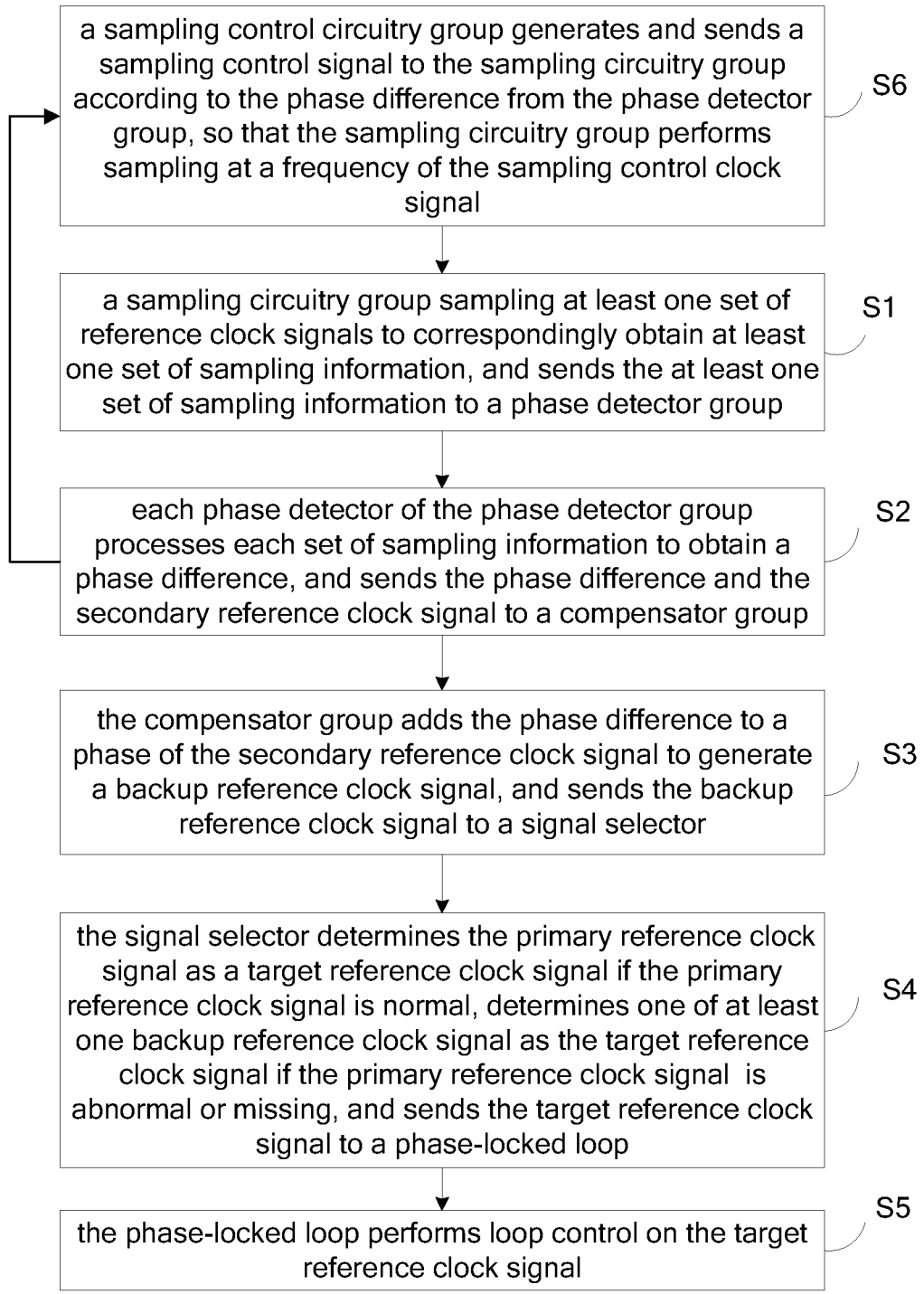
FIG. 18 is a flowchart of a method for hitless clock switching according to an embodiment of the present disclosure.
Figure 19:
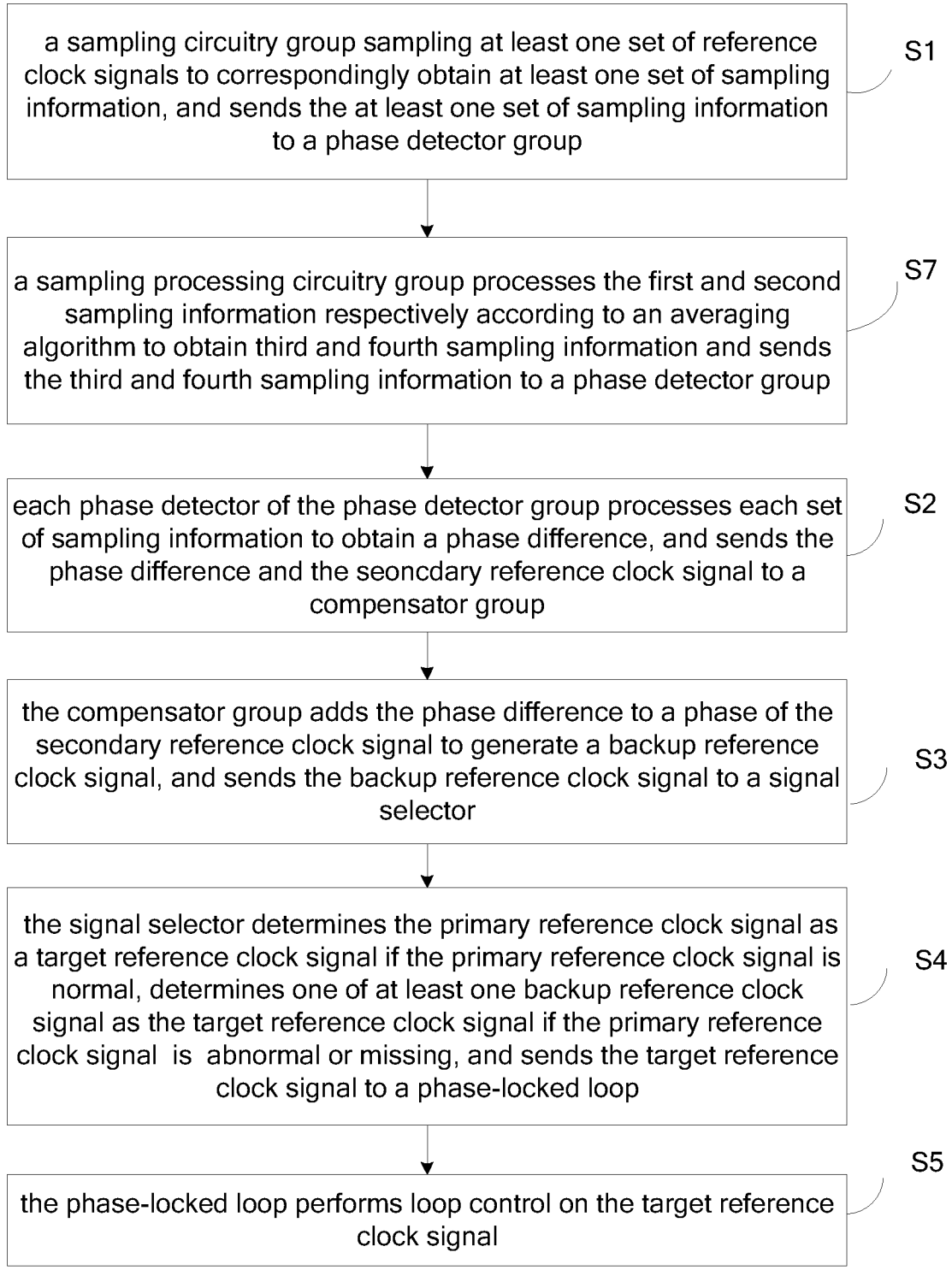
FIG. 19 is a flowchart of a method for hitless clock switching according to an embodiment of the present disclosure.

In view of this, in an embodiment of the present, each compensator in the compensator group 300 is also configured to receive the primary reference clock signal, as shown in FIG. 16. Thus, each compensator in the compensator group 300 of the present disclosure can determine whether the current primary reference clock signal is normal or abnormal or missing by receiving the primary reference clock signal.

When the primary reference clock signal is determined to be normal, no phase compensation is performed, that is, the compensator does not perform the phase accumulation operation even if the phase difference and the secondary reference clock signal sent by the corresponding connected phase detector are received. When the primary reference clock signal is determined to be abnormal or missing, the compensator may determine that clock switching is currently required. Based on this, each compensator adds the phase difference to the phase of the secondary reference clock signal according to the received phase difference and the secondary reference clock signal sent by the corresponding connected phase detector to obtain a backup reference clock signal.

In the embodiment of the present disclosure, the primary reference clock signal is received by the compensator group 300, so that each compensator in the compensator group 300 can determine whether the current primary reference clock signal is normal or abnormal or missing. Further, when it is determined that the current primary reference clock signal is normal, no phase compensation is performed, and when it is determined that the current primary reference clock signal is abnormal or missing, each compensator performs phase compensation, which ensures the resource utilization of the compensator group 300.

Preferably, the phase detector in the above embodiments is a digital phase detector.

The embodiment of the present disclosure further provides a method for hitless clock switching, which is applied to the system for hitless clock switching according to the above embodiments. The method includes steps S1 to S5.

In step S1, the sampling circuitry group samples at least one set of reference clock signals to correspondingly obtain at least one set of sampling information, and sends the at least one set of the sampling information to the phase detector group, where each set of reference clock signals includes a primary reference clock signal and a secondary reference clock signal, primary reference clock signals in different sets of reference clock signals are the same, secondary reference clock signals in different sets of reference clock signals are different, and each set of sampling information includes first sampling information corresponding to the primary reference clock signal and second sampling information corresponding to the secondary reference clock signal.

In step S2 each phase detector of the phase detector group processes a corresponding set of sampling information as received to obtain a phase difference, and sends the phase difference and the secondary reference clock signal to the compensator group.

In step s3, the compensator group adds the phase difference sent by each phase detector to a phase of the secondary reference clock signal to obtain a backup reference clock signal, and sends the backup reference clock signal to the signal selector, where the compensator group includes at least one compensator.

In step S4, the signal selector receives the primary reference clock signal and at least one backup reference clock signal sent by the compensator group, determines the primary reference clock signal as received as a target reference clock signal in a case that the primary reference clock signal is normal, determines one of the at least one backup reference clock signal as the target reference clock signal in a case that the primary reference clock signal is abnormal or missing and sends the target reference clock signal as determined to the phase-locked loop.

In step S5, the phase-locked loop performs loop control on the target reference clock signal as received.

In the method for hitless clock switching according to the present disclosure, the sampling circuitry group samples each set of reference clock signals to obtain a set of sampling information including the first sampling information and the second sampling information, each phase detector of the phase detector group receives and processes the set of the sampling information to obtain a phase difference, then the compensator group obtains a backup reference clock signal according to the phase difference sent by each phase detector and the secondary reference clock signal, and thus hitless switching is achieved by adding the phase difference to the phase of the secondary reference clock signal. When it is determined that the inputted primary reference clock signal is abnormal or missing, the signal selector selects one backup reference clock signal from the received at least one backup reference clock signal, determines the selected backup reference clock signal as the target reference clock signal, and sends the target reference signal as determined to the phase-locked loop. The phase-locked loop performs smoothing processing on the target reference clock signal to generate a stable clock signal, ensuring the stability of the phase and thereby guaranteeing the stable output of the clock signal and the stability of the performance of the clock device.

In an embodiment based on the above embodiment, the method may further include step S6.

In step S6, the sampling control circuitry group sends a sampling control clock signal to the sampling circuitry group according to the phase difference outputted by the phase detector group, so that the sampling circuitry group uses the frequency of the sampling control clock signal as a sampling frequency to sample, where the sampling control circuitry group is connected to the phase detector group and the sampling circuitry group.

In this embodiment, the sampling control circuitry group generates and sends a sampling control clock signal to the sampling circuitry group according to the phase difference outputted by the phase detector group, so that the sampling circuitry group samples at the frequency of the sampling control clock signal, which realizes the flexible adjustment of the sampling frequency of the sampling circuitry group and ensures the accuracy of the phase difference outputted by the phase detector group.

It should be noted that, for a specific process of the sampling control circuitry group controlling the sampling circuitry group, reference may be made to the corresponding description in the embodiment shown in FIGS. 2 and 3 above, which therefore will not be described herein.

In addition to the sampling control circuitry, in order to obtain a more accurate phase difference, the sampling processing circuitry can also be used to process the sampling information. Accordingly, in an embodiment of the present disclosure, the method for hitless clock switching may further include step S7.

In step S7, the sampling processing circuitry group processes the first and second sampling information respectively according to an averaging algorithm to obtain third and fourth sampling information and sends the third and fourth sampling information to the phase detector group, and the phase detector group obtains the phase difference according to the third and fourth sampling information, where the sampling circuitry group is connected to the phase detector group through the sampling processing circuitry group.

In this embodiment, the method steps performed by the sampling processing circuitry group are the same as those of the sampling processing circuitry group 700 in the embodiment shown in FIG. 6 or 7. Therefore, reference may be made to the description in the embodiment shown in FIG. 6 or 7 for the specific implementation and beneficial effects of the method in this embodiment, which will not be repeated here.

The method described in the above embodiments may be applied to the system for hitless clock switching in the foregoing embodiments. When applied to different systems for hitless clock switching, the method may be changed according to the structure of the corresponding system for hitless clock switching. For a specific process, reference may be made to the detailed description in the foregoing corresponding system embodiments, and therefore, the details are not repeatedly described in the present disclosure.

It should be noted that the embodiments in this specification is described in a progressive manner, and each embodiment focuses on the difference from the other embodiments, and reference may be made to each other for the same or similar parts between the various embodiments. The methods are described only briefly for they correspond to the device disclosed in the foregoing embodiments, and reference may be made to the corresponding description of the device embodiments for similar or relevant parts.

It should be further noted that the relationship terminologies such as "first", "second" and the like are only used herein to distinguish one entity or operation from another, rather than to necessitate or imply that the actual relationship or order exists between the entities or operations. Furthermore, terms of "include", "comprise" or any other variants are intended to be non-exclusive, so that a process, method, article or device including a plurality of elements includes not only the identified elements but also other elements that are not explicitly enumerated or the elements inherent for the process, method, article or device. Unless expressively limited otherwise, the statement "comprising (including) one . . . " does not exclude the case that other similar elements may exist in the process, method, article or device.

For the convenience of description, the above devices are described from the perspective of various function circuitries. Of course, the functions of the circuitries may be implemented in same or different software and/or hardware when implementing the present disclosure.

It will be apparent to those skilled in the art from the above description of the embodiments that the present disclosure can be implemented by means of software plus a necessary general hardware platform. Based on such understanding, the essence or the part contributing to conventional technology of the technical solution according to the present disclosure may be embodied in the form of a software product. The computer software product may be stored in a storage medium such as a ROM/RAM, a disk or an optical disk which includes instructions that, when being executed by a computer device, cause the computer device (which may be a personal computer, server, or network device) to perform the methods according to some or all of the foregoing embodiments.

The system and method for hitless clock switching according to the present disclosure are described in detail above. The principle and implementations of the present disclosure are described herein with reference to some specific examples. The descriptions about the embodiments are merely intended for ease of understanding of the method and core ideas of the present disclosure. A person of ordinary skill in the art may make modifications to the present disclosure in terms of the specific implementations and application scopes according to the ideas of the present disclosure. Therefore, the specification shall not be interpreted as a limit to the present disclosure.

The invention claimed is:

1. A system for hitless clock switching, comprising a sampling circuitry group, a phase detector group, a compensator group, a signal selector and a phase-locked loop that are sequentially connected, wherein the sampling circuitry group is configured to sample at least one set of reference clock signals to correspondingly obtain at least one set of sampling information and send the at least one set of sampling information to the phase detector group, wherein each set of reference clock signals comprises a primary reference clock signal and a secondary reference clock signal, primary reference clock signals in different sets of reference clock signals are the same, secondary reference clock signals in different sets of reference clock signals are different, and each set of sampling information comprises first sampling information corresponding to the primary reference clock signal and second sampling information corresponding to the secondary reference clock signal;

the phase detector group comprises at least one phase detector, wherein each phase detector receives a set of sampling information and processes the set of sampling information as received to obtain a phase difference, and sends the phase difference and the secondary reference clock signal to the compensator group;

the compensator group is configured to add the phase difference sent by each phase detector and a phase of the secondary reference clock signal sent by the same phase detector to obtain a backup reference clock signal, and send the backup reference clock signal to the signal selector, wherein the compensator group comprises at least one compensator;

the signal selector is configured to receive the primary reference clock signal and at least one backup reference clock signal sent by the compensator group, determine the primary reference clock signal as received as a target reference clock signal in a case that the primary reference clock signal is normal, determine one of the at least one backup reference clock signal as the target reference clock signal in a case that the primary reference clock signal is abnormal or missing, and send the target reference clock signal as determined to the phase-locked loop; and the phase-locked loop is configured to perform loop control on the target reference clock signal as received.

2. The system according to claim 1, wherein the system further comprises:

a sampling control circuitry group, wherein the sampling control circuitry group is connected to the phase detector group and the sampling circuitry group, and configured to generate a sampling control signal according to the phase difference outputted by the phase detector group and send the sampling control signal to the sampling circuitry group, whereby the sampling circuitry group performs sampling at a frequency of the sampling control signal.

3. The system according to claim 1, wherein the system further comprises:

a sampling processing circuitry group, wherein the sampling circuitry group is connected to the phase detector group through the sampling processing circuitry group, the sampling processing circuitry group is configured to process the first sampling information according to an averaging algorithm to obtain third sampling information, process the second sampling information according to the averaging algorithm to obtain fourth sampling information, and send the third sampling information and the fourth sampling information to the phase detector group, whereby the phase detector group obtains the phase difference according the third sampling information and the fourth sampling information.

4. The system according to claim 2, wherein the phase detector group comprises one phase detector, the compensator group comprises one compensator, the sampling circuitry group comprises a first sampling circuitry and a second sampling circuitry, the sampling control circuitry group comprises one sampling control circuitry, and the sampling control circuitry is configured to send the sampling control signal to the first sampling circuitry and the second sampling circuitry.

5. The system according to claim 3, wherein the phase detector group comprises one phase detector, the compensator group comprises one compensator, the sampling circuitry group comprises a first sampling circuitry and a second sampling circuitry, the sampling processing circuitry group comprises a first sampling processing circuitry and a second sampling processing circuitry, and the first sampling circuitry and the second sampling circuitry are connected to the first sampling processing circuitry and the second sampling processing circuitry respectively.

6. The system according to claim 2, wherein the phase detector group comprises at least two phase detectors, the sampling control circuitry group comprises at least two sampling control circuitries, the sampling circuitry group comprises at least two first sampling circuitries and at least two second sampling circuitries, the first sampling circuitry is configured to sample the primary reference clock signal to obtain the first sampling information, the second sampling circuitry is configured to sample the secondary reference clock signal to obtain the second sampling information, the numbers of the first sampling circuitries, the second sampling circuitries and the sampling control circuitries are the same as the number of the at least two phase detectors, the at least two sampling control circuitries are connected to the at least two phase detectors in one-to-one correspondence, each of the at least two phase detectors are connected to one first sampling circuitry and one second sampling circuitry, each of the sampling control circuitries is connected to the first sampling circuitry and the second sampling circuitry that are connected to a same phase detector and sends the sampling control signal to the first sampling circuitry and the second sampling circuitry that are connected to each other.

7. The system according to claim 6, wherein the compensator group comprises one compensator, and the compensator is connected to each of the at least two phase detectors.

8. The system according to claim 3, wherein the phase detector group comprises at least two phase detectors, the sampling circuitry group comprises one first sampling circuitry and at least two second sampling circuitries, the first sampling circuitry is configured to sample the primary reference clock signal to obtain the first sampling information, the second sampling circuitry is configured to sample the secondary reference clock signal to obtain the second sampling information, the sampling processing circuitry group comprises one first sampling processing circuitry and at least two second sampling processing circuitries, the first sampling processing circuitry is configured to process the first sampling information to obtain third sampling processing information, the second sampling processing circuitry is configured to process the second sampling information to obtain fourth sampling processing information, the first sampling circuitry is connected to the first sampling processing circuitry, the first sampling processing circuitry is connected to the at least two phase detectors, the at least two sampling circuitries are connected to the at least two sampling processing circuitries in one-to-one correspondence, and the at least two sampling processing circuitries are connected to the at least two phase detectors in one-to-one correspondence.

9. The system according to claim 3, wherein the phase detector group comprises at least two phase detectors, the sampling circuitry group comprises at least two first sampling circuitries and at least two second sampling circuitries, the first sampling circuitry is configured to sample the primary reference clock signal to obtain the first sampling information, the second sampling circuitry is configured to sample the secondary reference clock signal to obtain the second sampling information, the sampling processing circuitry group comprises at least two first sampling processing circuitries and at least two second sampling processing circuitries, the first sampling processing circuitry is configured to process the first sampling information to obtain third sampling processing information, the second sampling processing circuitry is configured to process the second sampling information to obtain fourth sampling processing information, the at least two first sampling circuitries are connected to the at least two first sampling processing circuitries in one-to-one correspondence, the at least two second sampling circuitries are connected to the at least two second sampling processing circuitries in one-to-one correspondence, the at least two first sampling processing circuitries and the at least two second sampling processing circuitries are connected to the at least two phase detectors in one-to-one correspondence.

10. The system according to claim 8, wherein the compensator group comprises one compensator, and the compensator is connected to each of the at least two phase detectors.

11. The system according to claim 9, wherein the compensator group comprises one compensator, and the compensator is connected to each of the at least two phase detectors.

12. The system according to claim 9, wherein the compensator group comprises at least two compensators, and the at least two phase detectors are connected to the at least two compensators in one-to-one correspondence.

13. The system according to claim 9, wherein the compensator group comprises at least two compensators, the number of the at least two phase detectors is greater than the number of the at least two compensators, at least one compensator is connected to more than one phase detector, and each phase detector is connected to only one compensator.

14. The system according to claim 9, wherein the compensator group comprises at least two compensators, the number of the at least two phase detectors is less than the number of the at least two compensators, each phase detector is connected to only one compensator and at least one compensator is connected to no phase detector.

15. The system according to claim 1, wherein
each compensator of the compensator group is configured to receive the primary reference clock signal; and
no compensator performs phase compensation in a case that it is determined that the primary reference clock signal is normal, and each compensator obtains the backup reference clock signal according to the phase difference and the secondary reference clock signal sent by the phase detector group in a case that it is determined that the primary reference clock signal is abnormal or missing.

16. A method for hitless clock switching, comprising:
sampling, by a sampling circuitry group, at least one set of reference clock signals to correspondingly obtain at least one set of sampling information, and sending the at least one set of sampling information to a phase detector group, wherein each set of reference clock signals comprises a primary reference clock signal and a secondary reference clock signal, primary reference clock signals in different sets of reference clock signals are the same, secondary reference clock signals in different sets of reference clock signals are different, and each set of sampling information comprises first sampling information corresponding to the primary reference clock signal and second sampling information corresponding to the secondary reference clock signal;
processing, by each phase detector of the phase detector group, a corresponding set of sampling information as received to obtain a phase difference, and sending the phase difference and the secondary reference clock signal to a compensator group;

adding, by the compensator group, the phase difference sent by each phase detector to a phase of the secondary reference clock signal from the same phase detector to obtain a backup reference clock signal, and sending the backup reference clock signal to a signal selector, wherein the compensator group comprises at least one compensator;

receiving, by the signal selector, the primary reference clock signal and at least one backup reference clock signal sent by the compensator group, determining the primary reference clock signal as received as a target reference clock signal in a case that the primary reference clock signal is normal, determining one of the at least one backup reference clock signal as the target reference clock signal in a case that the primary reference clock signal is abnormal or missing, and sending the target reference clock signal as determined to a phase-locked loop; and performing, by the phase-locked loop, loop control on the target reference clock signal as received.

17. The method according to claim 16, wherein the method further comprises:

generating, by a sampling control circuitry group, a sampling control signal according to the phase difference outputted by the phase detector group and sending the sampling control signal to the sampling circuitry group, whereby the sampling circuitry group performs sampling at a frequency of the sampling control clock signal.

18. The method according to claim 16, wherein the method further comprises:

processing, by a sampling processing circuitry group, the first sampling information and the second sampling information according to an averaging algorithm to respectively obtain third sampling information and fourth sampling information, and sending the third sampling information and the fourth sampling information to the phase detector group, whereby the phase detector group obtains the phase difference according to the third sampling information and the fourth sampling information.

* * * * *